(12) United States Patent
Hirata et al.

(10) Patent No.: US 9,091,744 B2
(45) Date of Patent: Jul. 28, 2015

(54) MAGNETIC RESONANCE IMAGING DEVICE

(75) Inventors: Satoshi Hirata, Kodaira (JP); Yoshitaka Bito, Kokubunji (JP)

(73) Assignee: HITACHI MEDICAL CORPORATION, Tokyo (JP)

( * ) Notice: Subject to any disclaimer, the term of this patent is extended or adjusted under 35 U.S.C. 154(b) by 490 days.

(21) Appl. No.: 13/697,122

(22) PCT Filed: May 2, 2011

(86) PCT No.: PCT/JP2011/060510
§ 371 (c)(1),
(2), (4) Date: Nov. 9, 2012

(87) PCT Pub. No.: WO2011/142289
PCT Pub. Date: Nov. 17, 2011

(65) Prior Publication Data
US 2013/0057285 A1 Mar. 7, 2013

(30) Foreign Application Priority Data
May 10, 2010 (JP) ................................. 2010-108283

(51) Int. Cl.
*G01V 3/00* (2006.01)
*G01R 33/485* (2006.01)
(Continued)

(52) U.S. Cl.
CPC .......... *G01R 33/485* (2013.01); *G01R 33/4833* (2013.01); *G01R 33/5607* (2013.01); *G01R 33/5617* (2013.01)

(58) Field of Classification Search
CPC ........................................... G01R 33/485
USPC ....................................................... 324/322
See application file for complete search history.

(56) References Cited

U.S. PATENT DOCUMENTS 4,480,228 A 10/1984 Bottomley
5,281,917 A * 1/1994 Santyr ........................... 324/309
(Continued)

FOREIGN PATENT DOCUMENTS

JP 59-107246 6/1984

OTHER PUBLICATIONS

Johs Star-Lack et al., Improved Water and Lipid Suppression for 3D Press CSI Using RF Band Selective Inversion with Gradient Dephasing (BASING), MRM 38, 1997, pp. 311-321.
(Continued)

*Primary Examiner* — Rodney Fuller
(74) *Attorney, Agent, or Firm* — Baker Botts L.L.P.

(57) ABSTRACT

An object of the present invention is to provide a measuring technique which allows in the MRS measurement to suppress with a high degree of precision, incorporation of a signal of unwanted compounds which hinders measurement of a measurement object signal, independent of an imaging object region and the measurement object signal, thereby obtaining a stable and favorable signal spectrum. In the MRS measuring sequence, a spectrum selective inversion RF pulse, having a narrow band characteristic for selectively inverting only a signal peak of a compounds to be suppressed, and phase dispersion-refocusing GC pulses are applied at least one of before and after a region selective RF pulse. This MRS measuring sequence is repeated while changing the echo time TE at predetermined intervals, and nuclear magnetic resonance signals being obtained by the repetition are integrated. The amount of the spectrum selective inversion RF pulse to be applied may be changed according to the echo time TE.

5 Claims, 10 Drawing Sheets

(51) Int. Cl.
*G01R 33/483* (2006.01)
*G01R 33/56* (2006.01)
*G01R 33/561* (2006.01)

(56) References Cited

U.S. PATENT DOCUMENTS

| | | | |
|---|---|---|---|
| 5,488,298 A * | 1/1996 | Wright et al. | 324/309 |
| 6,016,057 A * | 1/2000 | Ma | 324/309 |
| 6,181,134 B1 | 1/2001 | Wald | |
| 2004/0181146 A1* | 9/2004 | Yarnykh et al. | 600/419 |
| 2012/0262175 A1* | 10/2012 | Alsop et al. | 324/314 |
| 2013/0314086 A1* | 11/2013 | Li et al. | 324/309 |
| 2013/0335083 A1* | 12/2013 | Wasserman et al. | 324/309 |

OTHER PUBLICATIONS

Patrick J. Bolan et al., Eliminating Spurious Lipid Sidebands in $^1$H MRS of Breast Lesions, Magnetic Resonance in Medicin 48, 2002, pp. 215-222.

M. H. Buonocore et al., A New Spectral Editing MRS Sequence for Lactate and GABA Using a Unique Basing Pulse Combination for Coupled-Spin inversion at long TE, Proc. Intl. Soc. Mag. Reson. Med.15, 2007, pp. 2933.

Meir Shinnar, The Use of Finite Impulse Response Filters in Pulse Design, Magnetic Resonance in Medicine 12, 1989, pp. 81-87.

* cited by examiner

100

200

300

LIPID

LIPID

LIPID

CHOLINE
CREATINE
LIPID

MAGNETIC RESONANCE IMAGING DEVICE

CROSS REFERENCE TO RELATED APPLICATIONS

This application is a 371 continuation of application PCT/JP2011/060510 filed May 2, 2011.

TECHNICAL FIELD

The present invention relates to a technique for acquiring information by using a magnetic resonance imaging device, and more particularly, it relates to magnetic resonance spectroscopy (hereinafter, abbreviated as "MRS") technique for acquiring metabolic information within a living body.

BACKGROUND ART

The magnetic resonance imaging (hereinafter, abbreviated as "MRI") device irradiates (applies) a radio frequency magnetic field with a specific frequency to a subject placed in a static magnetic field, thereby exciting nuclear magnetization of an atomic nucleus in hydrogen or the like, contained in the subject, detecting a nuclear magnetic resonance signal generated from the subject, and acquires physical and chemical information. In addition to magnetic resonance imaging for imaging the nuclear magnetic resonance signal, a measuring technique using the MRI device includes MRS measurement, which makes use of a difference in resonance frequencies due to a chemical coupling between various molecules containing hydrogen nucleus (hereinafter, referred to as "chemical shift"), so as to separate nuclear magnetic resonance signals obtained from one to several regions into signals by molecule, thereby acquiring information of metabolites (see patent document 1, for instance).

The measuring method described in the patent document 1 is referred to as "PRESS method", and it is the most frequently used method as the MRS measurement at present, which localizes a region targeted for spectral measurement. In this PRESS method, after applying a gradient magnetic field (GC) pulse for selecting a predetermined slice, together with a radio frequency magnetic field (RF) pulse for exciting nuclear magnetization, GC pulses for selecting slices in two directions being orthogonal to the predetermined slice are applied respectively, together with an RF pulse for inverting the nuclear magnetization, and thereafter, measuring a nuclear magnetic resonance signal from a region (voxel) where the three slices intersect with one another. Then, the nuclear magnetic resonance signals thus measured are subjected to the Fourier transform in the time axis direction, and magnetic resonance spectra signals are obtained.

The MRS measurement has an outstanding advantage that it is capable of measuring a metabolite inside a human body noninvasively, this advantage being incomparable with other measuring methods, and it is spreading gradually in the clinical field in recent years. Particularly, the head region (brain) is rated as the most suitable organ for the MRS measurement. This is because the head region has an almost spherical shape, facilitating enhancement of static magnetic field homogeneity, and it is relatively easy to suppress enormous signals of water which hinder acquisition of extremely feeble signals from a metabolite. In addition, many of lipids in the head region, which may also be obstacles to acquisition of feeble metabolite signals, locally exist immediately under the scalp which is outside the scope of measurement. Therefore, they are suppressed without great difficulty and a preferable spectrum can be obtained easily and stably.

On the other hand, seen from a trend in these few years as to the MRS clinical applications, along with the performance advances of hardware and software of recent years, it becomes possible to stably enhance the static magnetic field homogeneity and to suppress water and lipids with high efficiency. Accordingly, the MRS is increasingly applied to a trunk of the body and four limbs. Recently in particular, breast MRS attracts rising attention, and it is expected that determination of followings will become possible; distinction between benignancy and malignancy of a tumor and prognosis of treatment, by measuring choline (Cho) which reflects exasperation of metabolism in cell membrane.

However, as for the breast MRS, unlike the head MRS, there exist a large amount of lipids inside the measurement region, and therefore, it is critical to suppress lipid signals, so as to obtain a preferable spectrum. By way of example, if only the water signal is suppressed, as performed in a general head MRS measurement but the lipid signals are not suppressed, the Cho signal is superimposed on a tail of enormous lipid signal peak (hereinafter, referred to "a lipid main-band signal"). Therefore, in some cases, a peak shape of the Cho signal itself may be distorted, failing to carry out accurate signal measurement. Furthermore, the lipid signal includes, not only the aforementioned lipid main-band signal, but also a lipid side-band signal, being a peak signal group which is generated in a rippling manner around the lipid main-band signal. The lipid side-band signal is generated due to the effect of the eddy current (GC eddy current), or the like, that the gradient magnetic field generates. When the lipid side-band signals are superimposed on the Cho signal generating band, it is considered as extremely difficult to make a distinction therebetween. For the reasons as described above, it is necessary to suppress the lipid signal with a high degree of precision, in order to perform stable breast MRS measurement.

Until now, there have been suggested various lipid suppression methods, and they fall roughly into four categories as described below:

1) Outside Measurement Region Suppression Method (Pre-Saturation Method)

This method excites in advance, a lipid region in proximity to the measurement region (outside region) before exciting the measurement region, by using a GC pulse for slice selection and an RF pulse for excitation, and thereafter, the method "renders a vector sum of transverse magnetization to zero (spoils the vector sum)" by a GC pulse for phase dispersion.

2) Zero-Cross Method (Zero Cross: a Point of Time when Longitudinal Elements of Inverted Magnetization Vector Sum Temporarily Become Zero)

This method inverts in advance, a lipid signal (proximity band) by using a spectrum selective inversion RF pulse before exciting the measurement region, and applies an RF pulse for exciting measurement region at "the time when the longitudinal elements of the magnetization vector sum during relaxation becomes zero".

3) T1 Independent Suppression Method (T1: Longitudinal Relaxation Time)

This method applies a spectrum selective inversion RF pulse, before and after applying a region selective inversion RF pulse for inverting transverse magnetization in the region being selected, and "spoils a signal in the selective inversion band (lipid main-band signal)" by phase dispersion/refocusing (positive and negative) GC pulses before and after the spectrum selective inversion RF pulse.

4) TE Shift Averaging Method (TE: Echo Time)

This method repeats the measurement while changing TE, and sums the obtained multiple spectra signals having different TEs, thereby allowing the lipid side-band signals to attenuate.

Among the aforementioned four lipid suppression methods, the method 1) outside measurement region suppression method, is literally a method to perform suppression of incorporated lipid signals entering from the outside of the measurement region, and thus it is not suitable for the case where lipids already exist within the measurement region such as the case of the breast MRS, even though this method is appropriate for the case where the measurement region corresponds to a portion neighboring subcutaneous lipids (brain), such as a head portion. In addition, in the zero-cross method 2), the zero-cross time fluctuates in the case where homogeneous inversion state cannot be obtained, and therefore, it is difficult to perform constantly stable suppression. By way of example, it is not possible to acquire homogeneous inversion state, in the following cases; there are various types of lipids within the measurement region, causing a distribution in T1, and there is inhomogeneity in B1 (a distribution of radio frequency magnetic field) of a transmission radio frequency coil.

The outside measurement region suppression method 1) and the zero-cross method 2) correspond to a "suppression method before main scan" that is previously executed before exciting the measurement region, whereas the T1 independent suppression method 3) is a "suppression method executed during the main scan". The T1 independent suppression method 3) is a method to selectively inverts and spoils only the transverse magnetization component of the lipid signals, out of the transverse magnetization components generated by the excitation of the measurement region. It is reported that this method is less sensitive to the T1 distribution and B1 inhomogeneities, thereby enabling stable suppression. The T1 independent suppression method 3) includes, for instance, the BASING method for adding a spectrum selective inversion RF pulse having a narrow band characteristic for selectively inverting only a peak of the lipid signals, and phase dispersion/refocusing GC pulses, before and/or after a region selective inversion RF pulse (for example, see the Non Patent Document 1). As for the spectrum selective inversion RF pulse being used here, an RF waveform thereof is optimized by the SLR algorithm, in order to enhance the spectrum selectivity of the RF pulse (e.g., see the Non Patent Document 2).

In addition, the TE shift averaging method 4) is not able to attenuate the lipid main-band signal, but it is able to attenuate a lipid side-band signal which is hard to be attenuated by other lipid signal suppression methods. Therefore, it is reported that the TE shift averaging method 4) is effective when the lipid side-band signal is superimposed on the Cho signal. The TE shift averaging method 4) may include, for instance, TE-Averaging method which repeats measurement while shifting little by little, the time for applying an RF pulse for selecting a voxel to be applied for the third iteration, and the time for starting signal detection, thereby measuring multiple spectra signals with various TEs, and sums the obtained signals as they are (e.g., see the Non Patent Document 3).

PRIOR ART DOCUMENT

Patent Document

Patent Document 1
Japanese Unexamined Patent Application Publication No. 59-107246

Non Patent Document

Non Patent Document 1
Star-Lack, J., et al.: Improved Water and Lipid Suppression for 3D PRESS CSI Using RF Band Selective Inversion with Gradient Dephasing (BASING). Magn. Reson. Med. 38, 311-321, 1997.
Non Patent Document 2
Shinnar, M. et al.: The Use of Finite Impulse Response Filters in Pulse Design. Magn. Reson. Med. 12, 81-87, 1989.
Non Patent Document 3
Bolan, P. J. et al.: Eliminating Spurious Lipid Side-bands in 1H MRS of Breast Lesions. Magn. Reson. Med. 48: 215-222, 2002.

DISCLOSURE OF THE INVENTION

Problem to be Solved by the Invention

As described above, the T1 independent suppression method 3) such as the BASING method as described above spoils the lipid main-band signal, and therefore, when the lipid main-band signal is large, it is effective. On the other hand, the TE shift averaging method such as the TE-Averaging method attenuates the lipid side-band signal, and therefore, it is effective when the lipid side-band signal is large. Above effectiveness has been proved by effectiveness verification using actual equipment. However, in the case where both the lipid main-band signal and the lipid side-band signal are large, it is not possible for the TE-Averaging method to suppress the lipid side-band signal, and it is not possible for the BASING method to attenuate the lipid main-band signal. Therefore, in some cases, any of the methods above fails to perform sufficient lipid suppression, depending on the region targeted for imaging.

In addition, a pre-scan conducted before the main scan allows prediction to some extent, what kind of lipid signal may come to be incorporated in, during the main scan. However, since the Cho signal is extremely feeble, and it is difficult to accurately estimate the influence on the Cho signal. Therefore, in the case where the breast MRS is executed in an actual clinical field, it is very difficult to determine accurately in advance, which is more suitable; the BASING method or the TE-Averaging method.

This happens not only for the breast MRS for measuring the Cho signal, but also for all aspects of the MRS measurement in the case where signals of enormous unwanted compounds exist in incorporated manner within the measurement region which is targeted for measuring feeble signals of metabolites.

The present invention has been made in view of the situations above, and an object of the present invention is to provide a measuring technique in the MRS measurement, the technique suppressing with a high degree of precision, incorporation of a signal of unwanted compounds which may hinder the measurement of the signal targeted for the measurement, independent of a region targeted for imaging and the signal targeted for the measurement, thereby obtaining a stable and favorable signal spectrum. More particularly, an object of the present invention is to provide a measuring technique in the breast MRS measurement, for suppressing with a high degree of precision, incorporation of a lipid signal which may hinder accurate measurement of a Cho signal, thereby obtaining a stable and favorable signal spectrum.

Means to Solve the Problem

The present invention is directed to application of a spectrum selective inversion RF pulse having a narrow band characteristic for selectively inverting only a signal peak of a compounds to be suppressed, and phase dispersion and refocusing GC pulses, at least one of before and after a region selective RF pulse in an MRS measurement sequence. Then, the MRS measurement sequence is repeated while changing the echo time TE at predetermined intervals, and nuclear magnetic resonance signals obtained by the repetition are integrated. It is to be noted that the amount of application of the spectrum selective inversion RF pulse may be changed according to the echo time TE.

Specifically, a magnetic resonance imaging device is provided, including a magnetic field generation means for generating a static magnetic field, a radio frequency magnetic field, and a gradient magnetic field, a detection means for detecting a nuclear magnetic resonance signal generated from a subject placed in the static magnetic field, a computing means for creating a magnetic resonance spectrum from the nuclear magnetic resonance signal and displaying the magnetic resonance spectrum on a display unit, and a measurement control means for controlling operations of the magnetic field generation means, the detection means, and the computing means, and executing spectrum measurement for collecting the nuclear magnetic resonance signals which allow the magnetic resonance spectrum to be created, the measurement control means being provided with a region selection means for applying at least one pair of a region selective inversion RF magnetic field and a slice selective gradient magnetic field, selectively inverting nuclear magnetization included only in a predetermined region, while repeating the spectrum measurement for a predetermined number of times with changing the echo time at predetermined shift intervals, and a suppression means for applying a spectrum selective inversion RF magnetic field for selectively inverting only the nuclear magnetization included in a predetermined compounds, at least one of before and after applying the region selective inversion RF magnetic field and the slice selective gradient magnetic field, and simultaneously applying a phase dispersion gradient magnetic field and a phase refocusing gradient magnetic field, being identical in the application amount (magnitude) and different in application polarity, before and after the spectrum selective inversion RF magnetic field, respectively.

Effect of the Invention

According to the present invention, it is possible in the MRS measurement to suppress with a high degree of precision, incorporation of a signal of unwanted compounds which hinders measurement of a signal targeted for the measurement, independent of an imaging targeted region and a measurement targeted signal, allowing acquisition of a stable and favorable signal spectrum. In particular, it is possible to suppress incorporation of a lipid signal with a high degree of precision, being an obstacle to accurate measurement of a Cho signal in the breast MRS measurement, allowing acquisition of a stable and favorable signal spectrum.

BEST MODE FOR CARRYING OUT THE INVENTION

First Embodiment

Hereinafter, there will be explained a first embodiment to which the present invention is applied. In the entire drawings for illustrating the present embodiment, the constituents having the same function will be labeled the same, and tedious explanation will not be made.

Figure 1A:
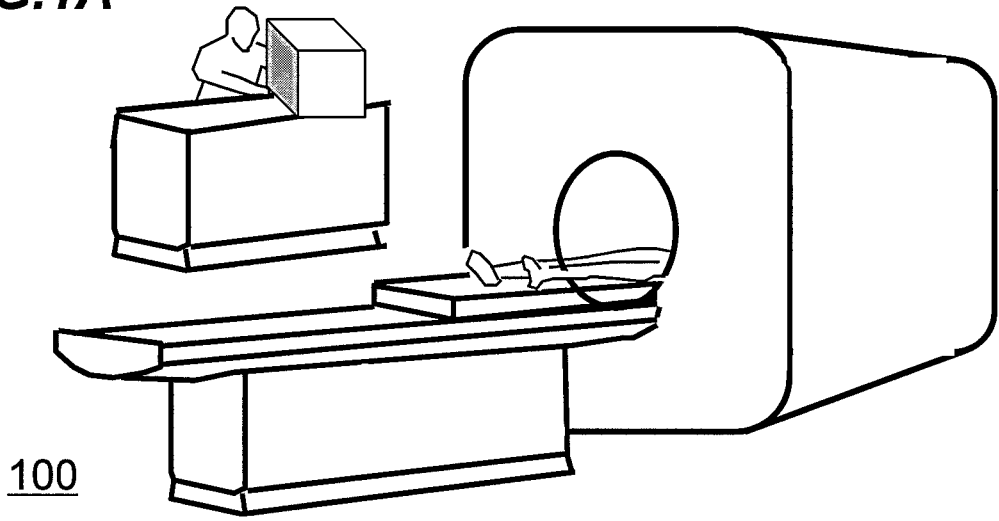
FIG. 1A is an external view of an MRI device according to a first embodiment, the MRI device being a horizontal magnetic field system.
Figure 1B:
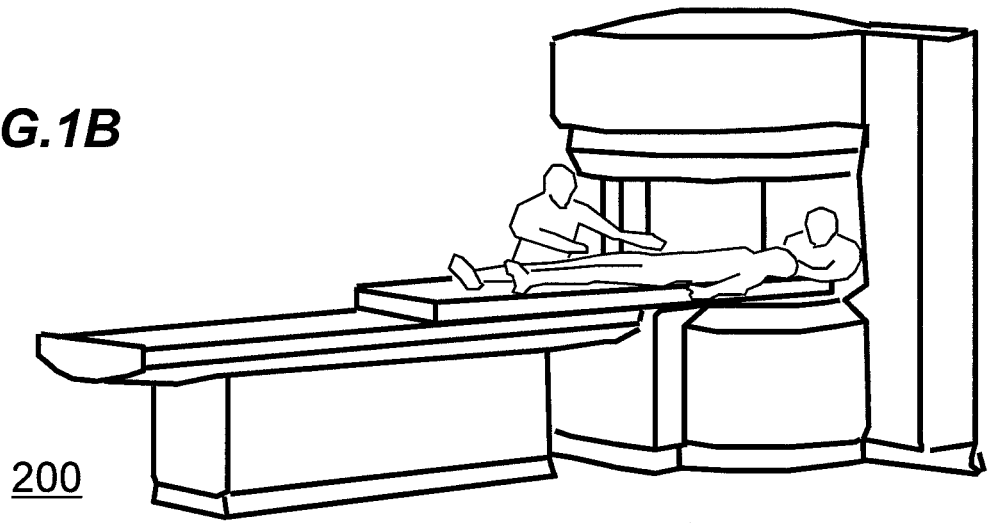
FIG. 1B is an external view of the MRI device being a vertical magnetic field system.
Figure 1C:
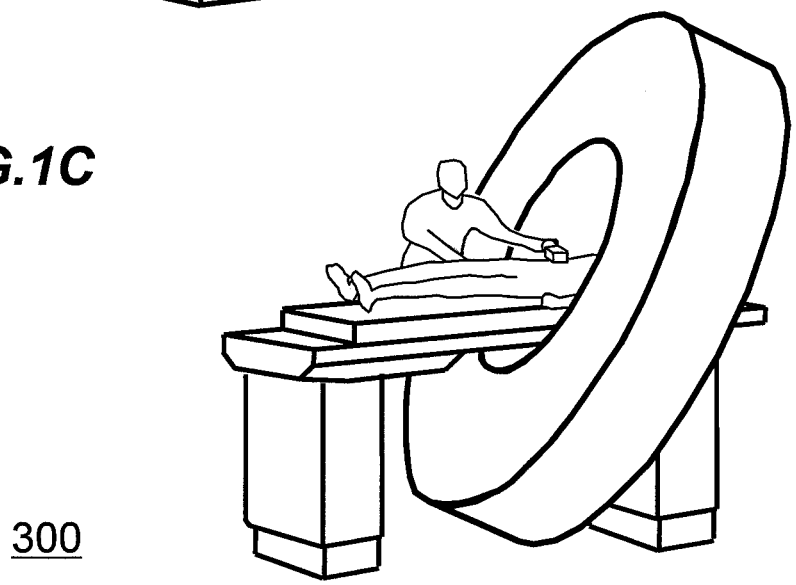
FIG. 1C is an external view of the MRI device being enhanced in a sense of openness.

Hereinafter, an MRI device according to the present embodiment will be explained. FIG. 1A to FIG. 10 are external views each showing the MRI device of the present embodiment. FIG. 1A illustrates the MRI device 100 being a horizontal magnetic field system which uses a tunnel-type magnet for generating a static magnetic field by a solenoid coil. FIG. 1B illustrates the MRI device 200 of a hamburger-type (open-type) vertical magnetic field system in which the magnets are separated vertically so as to enhance a sense of openness. FIG. 1C illustrates the MRI device 300 of the same tunnel-type as that of FIG. 1A, using a magnet with reduced depth and put in a slanting position, thereby enhancing the sense of openness more. These are just a few examples, and the MRI device of the present embodiment is not limited to those examples here. In the present embodiment, a publicly known various MRI devices may be employed, including any mode or any type thereof. Hereinafter, an explanation will be made, taking the MRI device 100 as an example.

Figure 2:
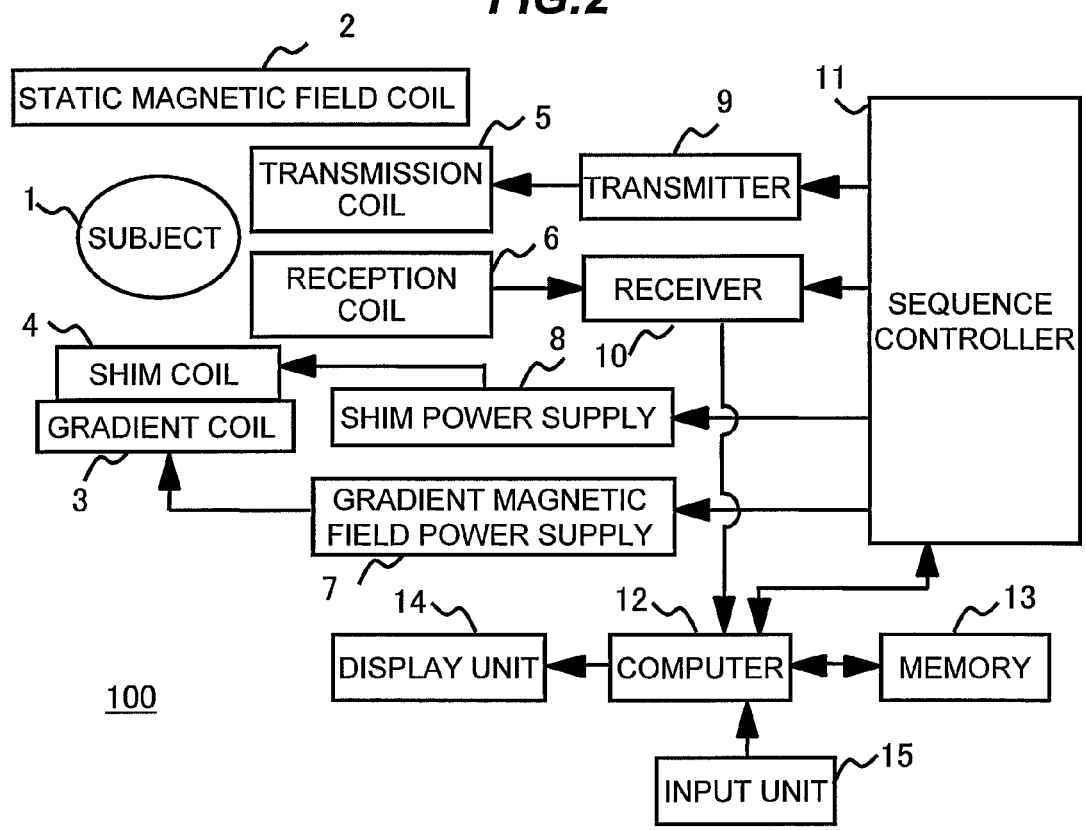
FIG. 2 is a block diagram showing a configuration of the MRI device according to the first embodiment.

FIG. 2 is a block diagram showing a configuration of the MRI device 100 according to the present embodiment. The MRI device 100 of the present embodiment is provided with a static magnetic field coil 2, a gradient coil 3, a shim coil 4, a transmission RF coil 5 (hereinafter, simply referred to as transmission coil), a reception RF coil 6 (hereinafter, simply referred to as a reception coil), a gradient magnetic field power supply 7, a shim power supply 8, a transmitter 9, a receiver 10, a sequence controller 11, a computer 12, a memory 13, a display unit 14, and an input unit 15.

The static magnetic field coil 2 forms the static magnetic field in the space where the subject 1 is placed. Various types of the static magnetic field coil 2 may be employed, depending on the structures of the MRI devices 100, 200, and 300 as shown in FIG. 1A, FIG. 1B and FIG. 1C, respectively.

The gradient coil 3 provides gradient magnetic fields (GC) in the three directions, being orthogonal to one another. The shim coil 4 controls the static magnetic field homogeneity. It is to be noted that the shim coil 4 may be unnecessary. The gradient coil 3 and the shim coil 4 are driven by the gradient magnetic field power supply 7 and the shim power supply 8, respectively.

The transmission coil 5 irradiates (applies) the radio frequency magnetic field (RF) to the subject 1. The transmitter 9 generates the radio frequency magnetic field (RF) which is applied by the transmission coil 5, and it is applied to the subject 1 placed in the static magnetic field. The reception coil 6 receives a nuclear magnetic resonance signal generated from the subject 1. The nuclear magnetic resonance signal detected by the reception coil 6 is transferred to the computer 12 via the receiver 10. In the present embodiment, an explanation will be made taking as an example, the case where the transmission coil 5 and the reception coil 6 are separately provided. However, it is possible to configure such that one coil is employed which serves both functions; the transmission coil 5 and the reception coil 6.

The sequence controller 11 controls the operations of the gradient magnetic field power supply 7, the shim power supply 8, the transmitter 9, and the receiver 10, thereby controlling application of the gradient magnetic field and the radio frequency magnetic field, receiving timing of the nuclear magnetic resonance signal, an amount of application, and the like. Control of the timing is performed according to a time chart, referred to as a "pulse sequence", whose settings are previously configured depending on an imaging method. The memory 13 stores the pulse sequence in advance. In addition, as for detailed conditions such as a selection of the pulse sequence to be used, and the amount of each application, may be registered previously in the memory 13 in the form of programs, or a user provides an instruction about such conditions via the input unit 15.

The computer 12 outputs a command to the sequence controller 11 according to the pre-registered program or the instruction from the user, and executes the imaging. In addition, the computer 12 performs various arithmetic processing on the nuclear magnetic resonance signal obtained via the receiver 10, and creates spectrum information and image information. The computer 12 is connected to the receiver 10, the sequence controller 11, the memory 13, the display unit 14, the input unit 15, and the like. The display unit 14 is an interface to display for the user, thus created spectrum information and image information. The input unit 15 is an interface for the user to input a measurement condition, a condition necessary for the arithmetic processing, parameters, and the like. The memory 11 records as needed, the spectrum information and image information created by the computer 12, information inputted via the input unit 15, the pulse sequence, and the like.

Next, an explanation will be made as to the pulse sequence which is employed in the MRS measurement according to the present embodiment. Prior to the explanation of the pulse sequence according to the present embodiment, there will be explained each imaging sequence of the followings; the symmetrical PRESS method being a basic measuring technique of the MRS measurement, and the methods categorized as the lipid suppression methods, the BASING method being T1 independent suppression method and the TE-Averaging method being the TE shift averaging method.

Firstly, with reference to FIG. 3, FIG. 4A, FIG. 4B and FIG. 4C, an explanation will be made as to a relationship, between operations of each constituent part and a region to be excited according to the PRESS method.

Figure 3:
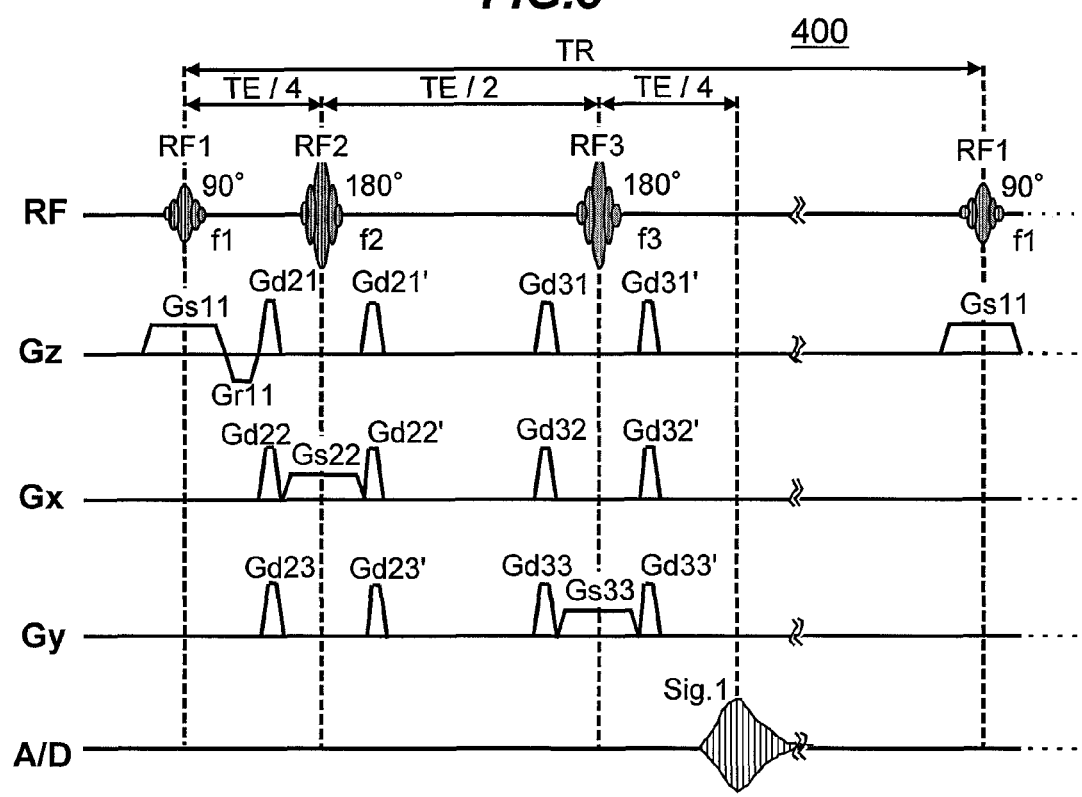
FIG. 3 illustrates a pulse sequence diagram of the PRESS method.

FIG. 3 illustrates the pulse sequence 400 of the symmetrical PRESS method. Here, the MRI device 100 being the horizontal magnetic field system is employed, and the direction of the static magnetic field is assumed as the Z-axis direction. In the present pulse sequence 400, "RF" indicates a timing for applying an radio frequency magnetic field, "Gz" indicates a timing for applying a gradient magnetic field in the Z-axis direction, "Gx" indicates a timing for applying the gradient magnetic field in the X-axis direction, "Gy" indicates a timing for applying the gradient magnetic field in the Y-axis direction, and "A/D" indicates a timing for acquiring a nuclear magnetic resonance signal (echo signal). These elements are labeled the same for each of the pulse sequences described in the present specification. In addition, "TE" indicates an echo time.

Figure 4A:
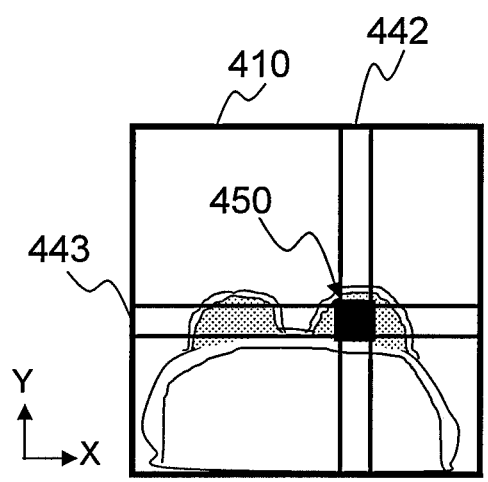
FIG. 4A illustrates a region which is excited and inverted by the PRESS method and is a transverse image for positioning.
Figure 4B:
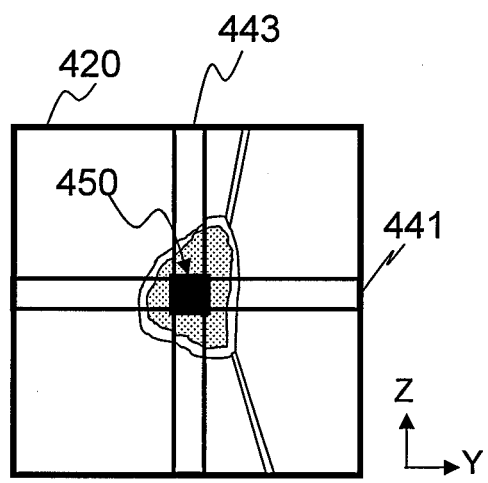
FIG. 4B illustrates a region which is excited and inverted by the PRESS method and is a sagittal image for location reference.
Figure 4C:
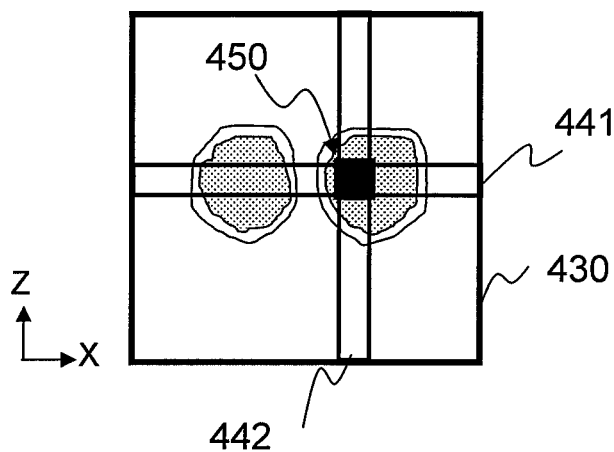
FIG. 4C illustrates a region which is excited and inverted by the PRESS method and is a coronal image for location reference.

FIG. 4A, FIG. 4B, and FIG. 4C illustrate regions being excited and inverted by the pulse sequence 400 as shown in FIG. 3. Images as shown in FIG. 4A, FIG. 4B, and FIG. 4C are scout images acquired for positioning and reference purposes prior to a main scan, and FIG. 4A shows a transverse image 410 for positioning, FIG. 4B shows a sagittal image 420 for location reference, and FIG. 4C shows a coronal image 430 for location reference. Here, a region (voxel) 450 is assumed as a region targeted for the measurement, and a first slice 441 perpendicular to the Z axis, a second slice 442 perpendicular to the X axis, and a third slice 443 perpendicular to the Y axis intersect on the region (voxel) 450.

Firstly, a high frequency magnetic field pulse (90° pulse) RF1 with the flip angle 90° is applied, together with applying a gradient pulse (slice selective GC pulse) Gs11 in the Z axis direction, and only the nuclear magnetization within the first slice 441 is selectively rendered to be in the excitation state. On this occasion, the transmit frequency f1 of the 90° pulse RF1 is determined in such a manner that the first slice 441 selected in combination with the slice selective GC pulse Gs11 contains the measurement object region 450. It is to be noted that as for all the high frequency magnetic field pulses (RF pulses) in the following, it is possible to adjust each of the transmit frequency, excitation (inversion) frequency band, excitation (flip) angle, and transmission phase, allowing optional change of "the slice position and thickness" for performing the selective excitation/inversion, and "the angle and direction for tilting the nuclear magnetization" included in the selected slice.

Next, after a lapse of TE/4 from the application of the 90° pulse RF1, an RF pulse (180° pulse) with the flip angle 180° is applied together with applying the slice selective GC pulse Gs22 in the X axis direction, thereby rendering only the nuclear magnetization included in the second slice 442 to be inverted by 180°, out of the nuclear magnetization within the first slice 441 that is excited by the pulse RF1. The transmit frequency f2 of the 180° pulse RF2 is determined in such a manner that the second slice 442 selected in combination with the slice selective GC pulse Gs22 includes the measurement object region 450.

Furthermore, after a lapse of TE/2 from the application of 180° pulse RF2, an RF pulse (180° pulse) RF3 with the flip angle 180° is applied together with applying the slice selective GC pulse Gs33 in the Y axis direction, allowing 180° inversion again of only the nuclear magnetization within the measurement object region 450 included in the third slice 443, out of the nuclear magnetization in the region where the first slice 441 and the second slice 442 intersect, being inverted by the 180° pulse RF2. The transmit frequency f3 of the 180° pulse RF3 is determined in such a manner that the third slice 443 selected in combination with the slice selective GC pulse Gs33 includes the measurement object region 450.

According to the applications of those three pairs of the slice selective GC pulse and the region selective RF pulse, the inside of the measurement object region 450 is selectively excited, and a nuclear magnetic resonance signal Sig. 1 is generated from the measurement object region 450, assuming the point of time after the lapse of TE/4 from the application of the 180° pulse RF3 as the echo time. The nuclear magnetic resonance signal Sig. 1 being generated has signal variation in the time axis direction, and includes information of the aforementioned chemical shift. The reception coil 6 detects this nuclear magnetic resonance signal Sig. 1 at predetermined sampling intervals, the computer 12 applies the Fourier transform to the signals in the time axis direction, and magnetic resonance spectra signals are obtained.

In the pulse sequence 400, the GC pulse Gr11 applied immediately after the application of the slice selective GC pulse Gs11 corresponds to a GC pulse for rephasing the slice selective GC pulse Gs11. The GC pulse Gd21 and the GC pulse Gd21', the GC pulse Gd22 and the GC pulse Gd22', and the GC pulse Gd23 and the GC pulse Gd23', being applied before and after applying the 180° pulse RF2, respectively, are GC pulses (dephasing GC pulses), which do not disturb the phase of the nuclear magnetization excited by applying the 90° pulse RF1, but perform dephasing (disturb the phase) only for the nuclear magnetization excited by applying the 180° pulse RF2, thereby reducing false signals. In addition, the GC pulse Gd31 and the GC pulse Gd31', the GC pulse Gd32 and the GC pulse Gd32', and the GC pulse Gd33 and the GC pulse Gd33', being applied before and after applying the 180° pulse RF3, respectively, are GC pulses (dephasing GC pulses), which do not disturb the phase of the nuclear magnetization excited by applying the 90° pulse RF1, but perform dephasing only for the nuclear magnetization excited by applying the 180° pulse RF3, thereby reducing false signals.

In the PRESS method, the pulse sequence 400 as described above is executed as the imaging sequence, thereby selectively exciting only the nuclear magnetization included in the measurement object region 450 where the three slices 441, 442, and 443 intersect as shown in FIG. 4A, FIG. 4B and FIG. 4C, and it is possible to detect the nuclear magnetic resonance signal Sig. 1 generated from the measurement object region 450.

If the integration of the signals is performed so as to obtain an SNR being required, the pulse sequence 400 is repeated at intervals of the repetition time TR, and the detection of the nuclear magnetic resonance signal Sig. 1 is repeated N times (N is a natural number; typically, from a few dozen times to hundreds of times). On this occasion, the entire measurement time becomes equal to "Repetition time×Integrating count=TR×N". This repetition time TR is determined according to the time required for the excited magnetization resumes to thermally equilibrated state as before the excitation, and it is changed depending on a type of the metabolite as a target for excitation, an irradiation RF strength (flip angle) for performing the excitation, and the like. In the case where the nuclear magnetization of a typical metabolite within a human body, being measurable by the MRS, is excited by the 90° pulse, the repetition time TR is set to be around from one to two seconds, in general.

Figure 5A:
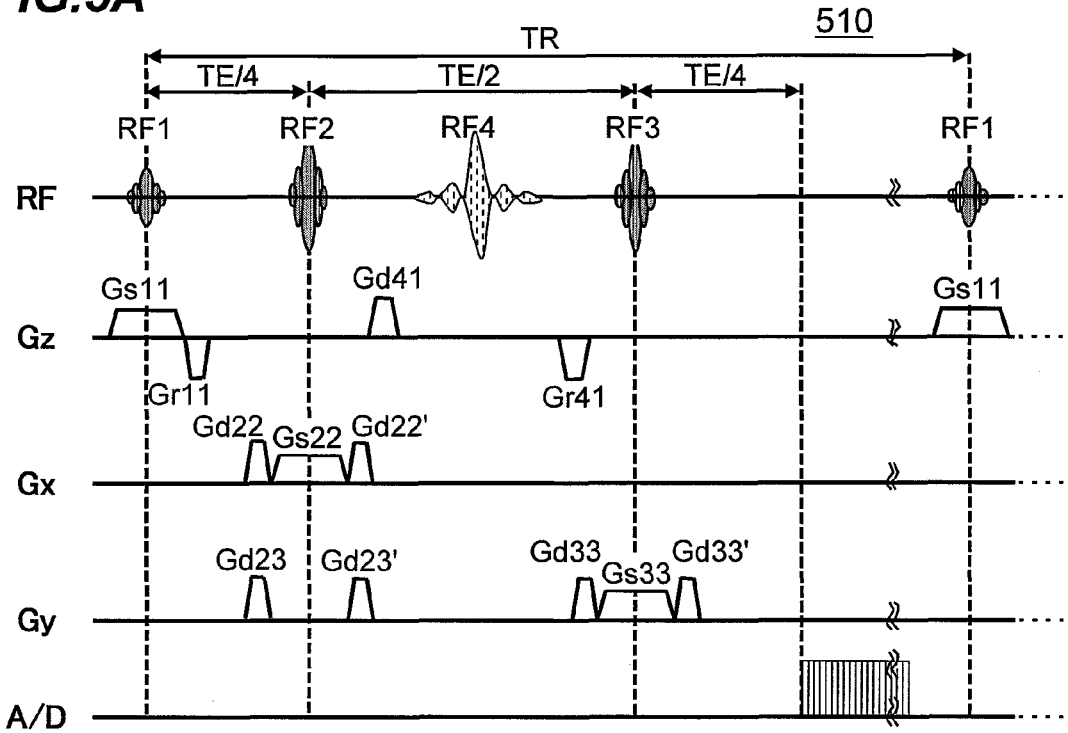
FIG. 5A is a pulse sequence diagram of Single BASING method.
Figure 5B:
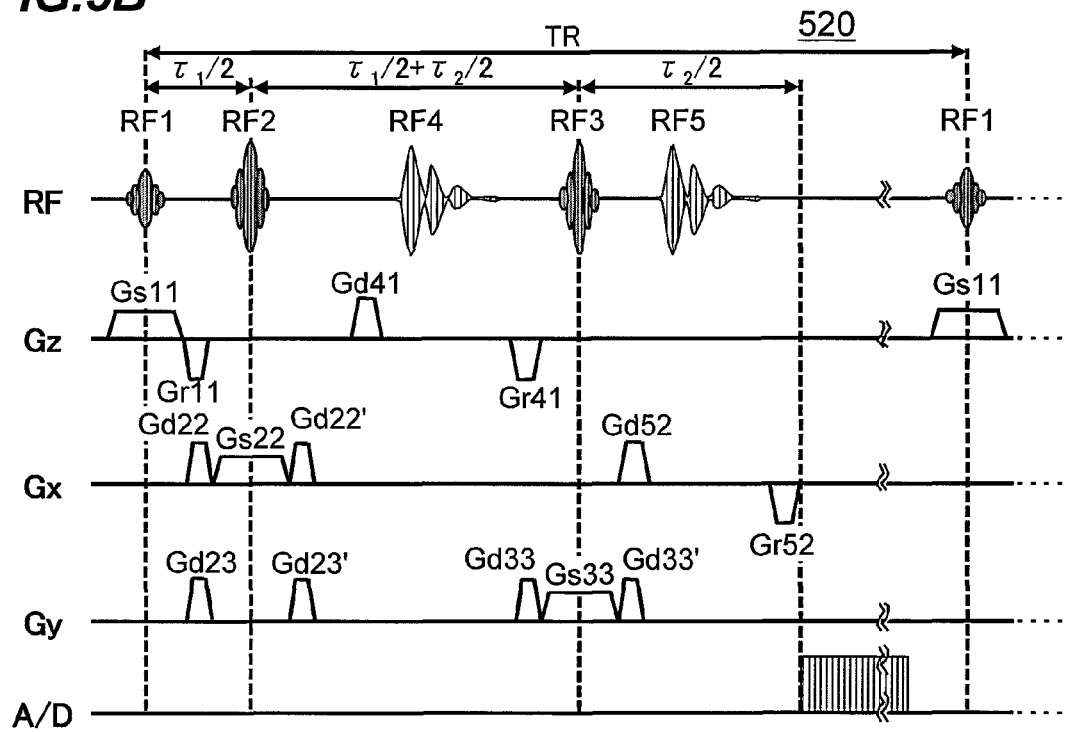
FIG. 5B is a pulse sequence diagram of Dual BASING method.

Next, an explanation will be made as to a pulse sequence of the BASING method, being a representative measuring technique of the T1 independent suppressing method. FIG. 5A and FIG. 5B illustrate pulse sequences which are used in the BASING method. The BASING method uses the pulse sequence which is obtained by adding to the pulse sequence of the PRESS method, a spectrum selective inversion RF pulse having the narrow band characteristic for selectively inverting only a lipid signal peak, a phase dispersion GC pulse, and a phase refocusing GC pulse. For the spectrum selective inversion RF pulse, an RF waveform being optimized by a publicly known SLR algorithm is employed, in order to enhance spectrum selection characteristics. In FIG. 5A and FIG. 5B, a pulse having the same mode of action as in the pulse sequence 400 of the PRESS method shown in FIG. 3 is labeled the same. Hereinafter, the spectrum selective inversion RF pulse is referred to as an SP selective RF pulse, and a combination of the phase dispersion GC pulse and the phase refocusing GC pulse is referred to as dispersion-refocusing GC pulses.

As described above, there are two types for the BASING method. FIG. 5A shows an example of the pulse sequence 510 of the Single BASING method which applies onetime, the SP selective RF pulse and the positive and negative dispersion-refocusing GC pulses, and FIG. 5B shows an example of the pulse sequence 520 of the Dual BASING method which applies two times, the SP selective RF pulse and the positive and negative dispersion-refocusing GC pulses.

As shown in FIG. 5A, in the pulse sequence 510 of the Single BASING method, one pair of the SP selective RF pulse RF 4, and the dispersion-refocusing GC pulses Gd41 and Gr41 are applied before the third 180° pulse RF3. The dispersion-refocusing GC pulses Gd41 and Gr41 are GC pulses having the same application amount (magnitude) with different application polarities, positive and negative, and these are applied before and after the SP selective RF pulse RF4, respectively. As the SP selective RF pulse RF4 to be applied, a symmetrical waveform being a sinc waveform which is optimized by the SLR algorithm is used, for instance. This is because, spectrum excitation characteristics of the optimized symmetrical sinc waveform are provided with both a high amplitude flatness and phase linearity.

As shown in FIG. 5B, in the pulse sequence 520 of the Dual BASING method, a pair of the SP selective RF pulse and the positive and negative dispersion-refocusing GC pulses is applied, both before and after the third 180° pulse RF3. Here, the SP selective RF pulse RF4 and the positive and negative dispersion-refocusing GC pulses Gd41 and Gr41 are applied before the 180° pulse RF3, and the SP selective RF pulse RF5 and the positive and negative dispersion-refocusing GC pulses Gd52 and Gr52 are applied after the 180° pulse RF3.

In the Dual BASING method sequence 520, the SP selective RF pulse RF5 is added between the end time of the 180° pulse RF3 originally having a narrow interval, and the time for starting acquisition of an echo signal. Therefore, the echo time ($\tau_2$) of the 180° pulse RF3 is set to be longer than the echo time ($\tau_1$) of the second region selective RF pulse RF2 ($\tau_2 > \tau_1$). This kind of sequence is referred to an asymmetric sequence. On the other hand, the Single BASING sequence 510 of FIG. 5A is referred to as a symmetric sequence.

The BASING method executes the aforementioned pulse sequence 510 or 520 as the imaging sequence, and detects a nuclear magnetic resonance signal from inside the measurement object region 450 as shown in FIG. 4A, FIG. 4B and FIG. 4C. On this occasion, compounds other than the lipids are free of the influence of the SP selective RF pulses RF4 and RF5. This is because the SP selective RF pulses RF4 and RF5 are adjusted to have the narrow band characteristic which selectively inverts only the lipid signal peak. In addition, the dispersion-refocusing GC pulses Gd41, Gd52, Gr41, and Gr52 only have a mode of action which once disperses the transverse magnetization and thereafter refocuses it to its original state, the transverse magnetization being generated by applying the 90° pulse RF1, 180° pulse RF2, 180° pulse RF3, and three slice selective GC pulses Gs11, Gs22, and Gs33 inside the measurement object region 450. Therefore, according to the pulse sequences 510 and 520 of the BASING method, it is possible to obtain spectra signals of the compounds other than the lipids, from the measurement object region 450, in a similar manner as when the aforementioned pulse sequence 400 of the PRESS method is executed.

On the other hand, the transverse magnetization of the lipids within the measurement object region 450, being generated by applying the 90° pulse RF1, 180° pulse RF2, 180° pulse RF3, and three slice selective GC pulses Gs11, Gs22, and Gs33, is inverted (rotated by 180 degrees) by the SP selective RF pulses RF4 and RF5. Therefore, according to the modes of action of the dispersion-refocusing GC pulses Gd41, Gd52, Gr41, and Gr52, only the transverse magnetization of the lipids goes into a pseudo saturation state, and the spectra signals from the lipids may disappear or attenuate. It is to be noted that the pseudo saturation state indicates that the phases of the respective transverse magnetization vectors are dispersed, and the vector sum thereof approaches zero.

The transmit frequency (center frequency) when the SP selective RE pulses RF4 and RF5 are applied is tuned to the resonance frequency of the lipid peak. Therefore, the signals are suppressed only in a frequency band in proximity the lipid peak (lipid main-band signal). This proximity frequency band corresponds to a bandwidth of the narrow band characteristic of the SP selective RF pulses RF4 and RF5.

Next, the TE-Averaging method will be explained, which is a representative measuring technique of the TE shift averaging. The TE-Averaging method repeats execution of the sequence for the MRS measurement such as the PRESS method, while gradually shifting the time for applying the 180° pulse RF3 and the time for starting signal detection. Accordingly, in the TE-Averaging method, multiple spectra signals being different in the echo time TE are measured, and the signals being obtained are integrated as they are.

Figure 6:
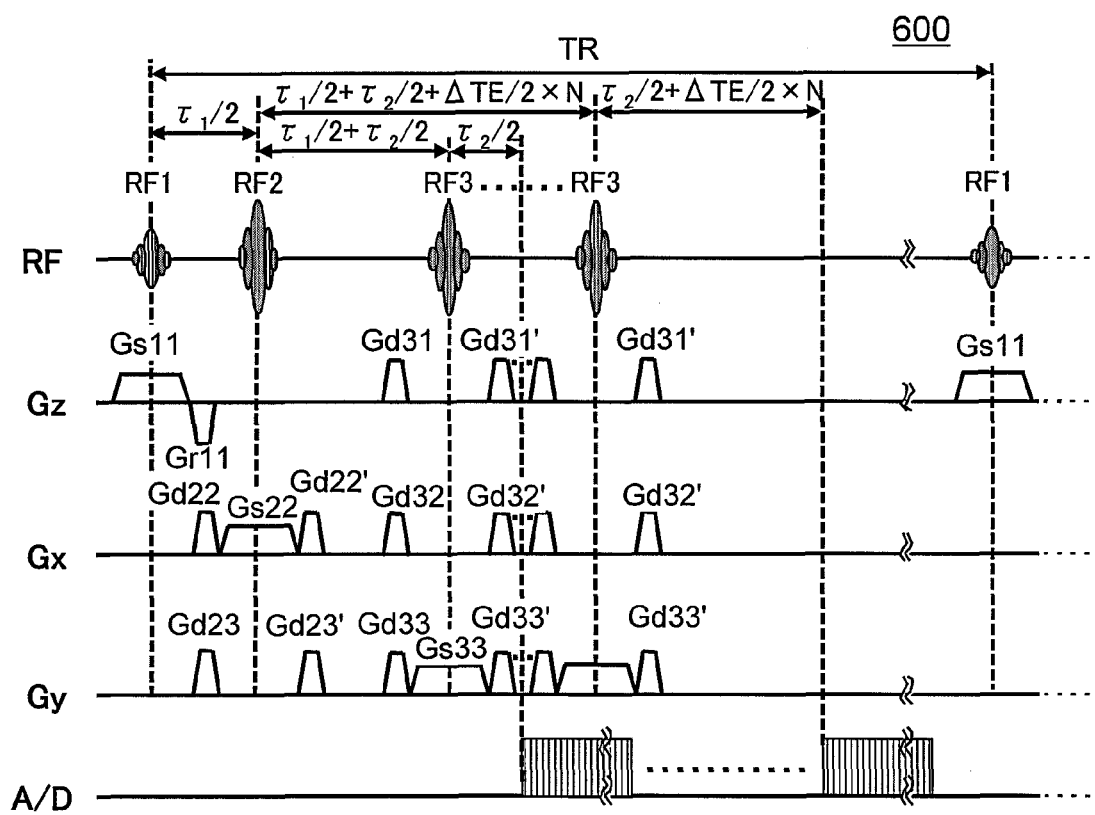
FIG. 6 is a pulse sequence diagram of TE-Averaging method.

FIG. 6 illustrates one example of the pulse sequence 600 which is used in the TE-Averaging method. Here, there is explained as an example, the case where the sequence of the MRS measurement uses the PRESS method which employs the asymmetric sequence. The pulses having the same mode of action as in the pulse sequence 400 of the PRESS method shown in FIG. 3 are labeled the same. As shown in the figure, the pulse sequence of the PRESS method is repeated to configure the pulse sequence 600. On this occasion, every time of the repetition, the echo time is made to shift only by ΔTE.

In the case where a typical MRS measurement sequence (e.g., the pulse sequence 400 of the PRESS method) is repeatedly executed and integrated, eddy current caused by the GC pulses generates lipid side-band signals. The eddy current is a circulating flow of current induced by the generated magnetic field, which flows in a magnet bore inner surface or in a human body surface. When the lipid side-band signals are superimposed on the frequency band where a Cho signal is generated, there is a possibility that no distinction is made between the lipid side-band signal and Cho signal. However, according to the TE-Averaging, multiple spectra signals are obtained, each having a cycle for generating (a peak position on the spectrum of) the lipid side-band signals, being shifted little by little, and those signals are integrated. Therefore, the lipid side-band signals displaced by a half-cycle may be cancelled or weakened, thereby allowing an embedded Cho signal to be correctly detected.

It is to be noted that in the aforementioned Non Patent Document 3, there is disclosed an example that the TE shift interval is set to be 2.4 ms, and the spectra corresponding to 64 shifts measured in the range of TE being from 45 to 196.2 ms, are integrated, thereby suppressing the lipid side-band signals. Similar measurement conditions are used in other reported examples.

The BASING method and the TE-Averaging method as discussed above are not in a competitive relation, but in a complementary relation, as far as considering only the effects of both suppression methods. However, as described above, the variation of the echo time TE used in the TE-Averaging method falls into the range from 45 ms to 196.2 ms, whereas the pulse length of the SP selective RF pulse used in the BASING method falls into the range from 30 ms to 50 ms. Therefore, even though an RF pulse used in the BASING method is tried to be inserted into the variation range of the echo time TE of the TE-Averaging method, there occurs a lack of vacant time. The MRS measurement method of the present embodiment also considers this point and configures a pulse sequence in such a manner that the effects of both suppression methods can be obtained.

Next, an explanation will be made as to the MRS measurement method according to the present embodiment. In the present embodiment, a pulse sequence of the PRESS method is used as the pulse sequence for implementing the MRS measurement. In addition, in the MRS measurement of the present embodiment, an SP selective RF pulse and dispersion-refocusing GC pulses are applied so as to suppress lipids, similar to the Dual BASING method. In addition, the measurement using this pulse sequence is repeated, while shifting the time for applying the 180° pulse RF3 and the time for starting signal detection, little by little, and multiple signals being different in the time TE are integrated.

On this occasion, in the MRS measurement method of the present embodiment, the TE shift interval is made to be narrower, or the TE shifting count is reduced, thereby narrowing the variation range of TE. Then, even in the case where TE is the shortest, a vacant time is reserved for inserting the SP selective RF pulse with a pulse length which allows a signal from the compounds targeted for suppression to be equal to or less than a signal from the metabolite being the measurement object.

Figure 7A:
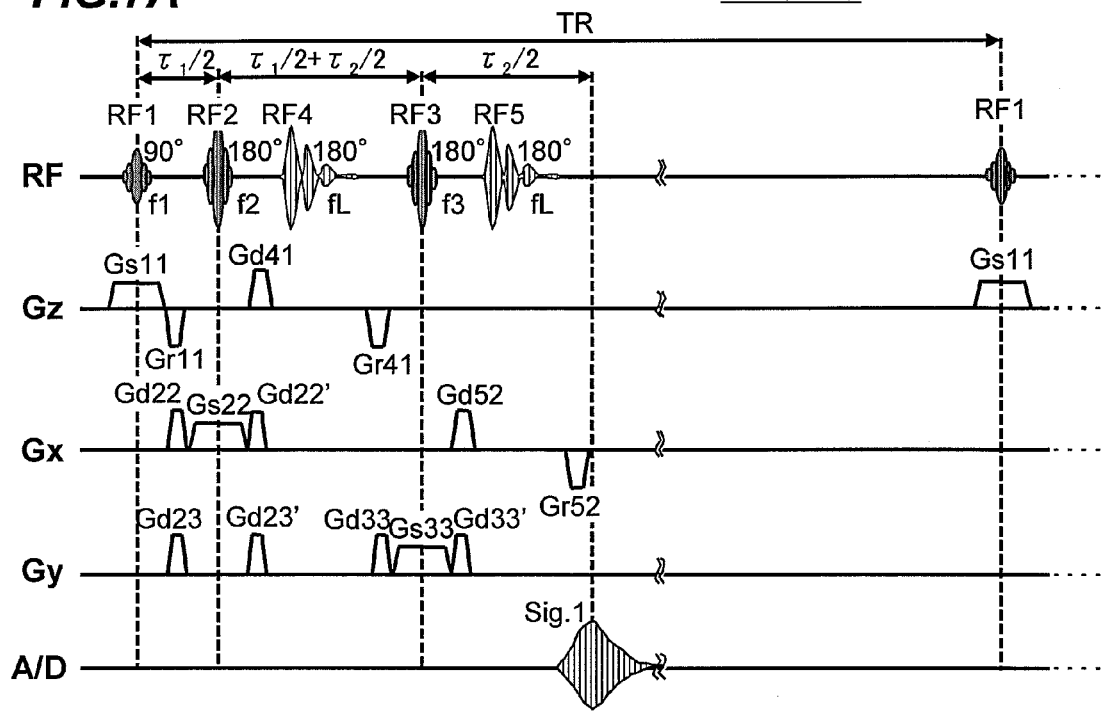
FIG. 7A is a pulse sequence diagram of the unit sequence with the echo time being the shortest according to the first embodiment.
Figure 7B:
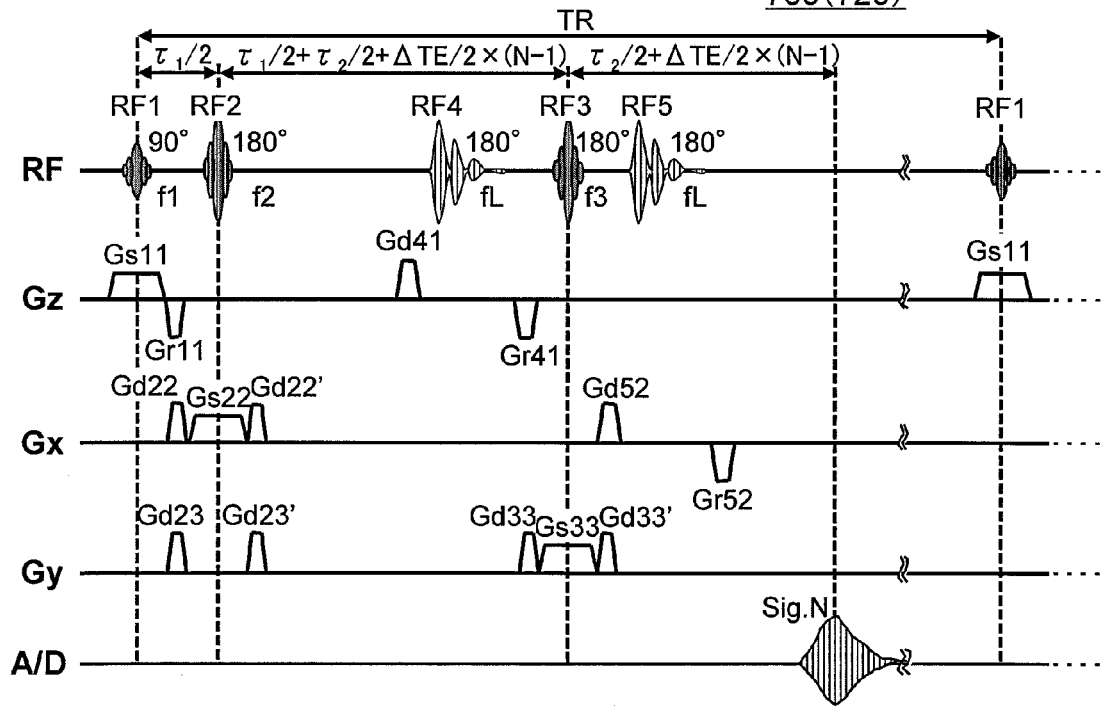
FIG. 7B is a pulse sequence diagram of the unit sequence with the echo time being the longest according to the first embodiment.

Hereinafter, characterizing portions of the pulse sequence according to the present embodiment will be explained with reference to the accompanying drawings. FIG. 7A and FIG. 7B illustrate the MRS sequences 700 being the pulse sequences of the present embodiment. Here, the pulses having the same mode of action as those in the aforementioned pulse sequences are labeled the same.

The MRS sequence 700 of the present embodiment is configured as a repetition of a unit sequence from applying the 90° pulse RF1 until receiving an echo signal Sig, in the pulse sequence 520 of the Dual BASING method. During the repetition, similar to the aforementioned TE-Averaging method, the time for applying the 180° pulse RF3 and a time for starting signal detection are made to shift little by little, thereby changing the echo time TE. FIG. 7A shows the unit sequence 710 which has the shortest echo time TE of the MRS sequence 700 according to the present embodiment, and FIG. 7B shows the unit sequence 720 which has the longest echo time TE.

Firstly, the unit sequence 710 for the case of the shortest TE as shown in FIG. 7A will be explained in detail. The aforementioned FIG. 4A, FIG. 4B and FIG. 4C will be used again to explain the region that is excited and inverted by this pulse sequence.

Firstly, together with applying the slice selective GC pulse Gs11 in the Z axis direction, an excitation RF pulse (90° pulse) RF1 with the flip angle 90 degrees is applied, thereby selectively rendering only the nuclear magnetization within the first slice 441 to be in the excitation state. The transmit frequency f1 of the 90° pulse RF1 and the excitation band are determined in such a manner that the first slice 441 selected in combination with the slice selective GC pulse Gs11 includes the measurement object region 450.

Next, after a lapse of time ($\tau_1/2$) from the application of the 90° pulse RF1, an RF pulse (180° pulse) RF2 with the flip angle 180 degrees is applied together with the slice selective GC pulse Gs22 in the X axis direction, thereby allowing only the nuclear magnetization included in the second slice 442 is inverted by 180 degrees, among the nuclear magnetization within the first slice 441 that is excited by the 90° pulse RF1. Here, $T_1$ indicates the echo time of the 180° pulse RF2. Therefore, the unit sequence 710 configures an asymmetric pulse sequence in which the application interval is constantly fixed to ($\tau_1/2$) between the 90° pulse RF1 and the 180° pulse RF2. The transmit frequency f2 of the 180° pulse RF2 and the excitation band are determined in such a manner that the second slice 442 that is selected in combination with the slice selective GC pulse Gs22 includes the measurement object region 450.

Furthermore, in the unit sequence 710, just after applying the slice selective GC pulse Gs22, a phase dispersion GC pulse Gd41, a spectrum selective inversion RF pulse (SP selective RF pulse) RF4 having the narrow band characteristic for selectively inverting only the lipid signal peak, and a phase refocusing GC pulse Gr41 are applied. The reason why these pulses are applied in a time interval as short as possible after applying the slice selective GC pulse Gs22 is to reserve a time for applying the SP selective RF pulse RF4. The SP selective RF pulse RF4 inverts again only the nuclear magnetization (transverse magnetization) included in the lipids by 180 degrees, among the nuclear magnetization within the region where the first slice 441 and the second slice 442 are intersecting being inverted by the 180° pulse RF2. In addition, according to the mode of actions of the dispersion-refocusing GC pulses Gd41 and Gr41, only the nuclear magnetization (transverse magnetization) included in the lipids is brought into the pseudo saturation.

On this occasion, the transmit frequency fL of the SP selective RF pulse RF4 is tuned to the resonance frequency of the lipid. In addition, as a waveform of the SP selective RF pulse RF4, an "asymmetric High-Pass waveform" is used, in which parameters such as a pass efficiency (flatness) of a pass band, a suppression rate (flatness) of a stop band, and a width of transition band are optimized under predetermined conditions. Here, the pass band indicates a band where a metabolite signal targeted for the measurement is generated, the stop band indicates a band where a lipid signal targeted for the suppression is generated, and the transition band indicates an intermediate band between the pass band and the stop band. The High-Pass waveform indicates an RF waveform having frequency characteristics for placing a signal peak of the suppression object compounds (here, the lipid) at the center of the excitation (stop) band, and allowing the signals in the other band (band having the frequency "High") to pass through. Each of the parameters is optimized so that the SP selective RF pulse is provided with the narrow band characteristic which selectively inverts only the signal peak of the suppression object compounds, without any influence on the signal peak of the measurement object compounds. In addition, the optimization of the waveform of the SP selective RF pulse RF4 is performed after setting the application time of the SP selective RF pulse RF4 (a pulse length of RF4) to be a predetermined length.

Next, after a lapse of ($\tau_1/2+\tau_2/2$) from the application of the 180° pulse RF2, the 180° pulse RF3 is applied together with the slice selective GC pulse Gs33 in the Y axis direction, and among the nuclear magnetization within the region where the first slice 441 and the second slice 442 being inverted by the 180° pulse RF2 are intersecting, only the nuclear magnetization within the measurement object region 450 also included in the third slice 443 is inverted by 180 degrees again. The transmit frequency f3 and excitation band of the 180° pulse RF3 on this occasion are determined in such a manner that the third slice 443 selected in combination with the slice selective GC pulse Gs33 includes the measurement object region 450.

The shortest echo time of the 180° pulse RF3 is represented by 12, and it is set according to the following formula (1). This is set in this manner so as to reserve the time for applying the SP selective RF pulses RF4 and RF5, respectively in the interval between the end time for applying the 180° pulse RF2 and the start time for applying the 180° pulse RF3, and in the interval between the end time for applying the 180° pulse RF3 and the start time for detecting the signal.

$$\tau_2 \geq RF3 \text{ application time} + Gd41 \text{ application time} + RF4 \\ \text{application time} + Gr41 \text{ application time} + Gd52 \\ \text{application time} + RF5 \text{ application time} + Gr52 \\ \text{application time} \quad (1)$$

In the unit sequence 710 of the present embodiment, the settings are configured such that the application time of the dispersion GC pulse Gd41 is equal to the application time of the dispersion GC pulse Gd52, the application time of the SP selective RF pulse RF4 is equal to the application time of the SP selective RF pulse RF5, and the application time of the refocusing GC pulse Gr41 is equal to the application time of the refocusing GC pulse Gr52. Therefore, the aforementioned formula (1) may be modified as the following formula (2):

$$\tau_2 \geq RF3 \text{ application time} + Gd52 \text{ application time} \times 2 + \\ RF5 \text{ application time} \times 2 + Gr52 \text{ application time} \times 2 \quad (2)$$

Then, immediately after applying the slice selective GC pulse Gs33, in an interval as short as possible, the phase dispersion GC pulse Gd52, the spectrum selective inversion RF pulse (SP selective RF pulse) RF5 having the narrow band characteristic to selectively inverse only the lipid signal peak, and the phase refocusing GC pulse Gr52 are applied. Among the nuclear magnetization within the region (measurement object region) 450, where the first slice 441, the second slice 442, and the third slice 443 are intersecting, being inverted by the 180° pulse RF3, only the nuclear magnetization (transverse magnetization) included in the lipids is inverted by 180 degrees again by the SP selective RF pulse RF5. In addition, according to the mode of actions of the dispersion-refocusing GC pulses Gd52 and Gr52, only the nuclear magnetization (transverse magnetization) included in the lipids is brought into the pseudo saturation. On this occasion, the transmit frequency fL of the SP selective RF pulse RF5 is tuned to the resonance frequency of the lipid. As a waveform used for the SP selective RF pulse RF5, the "asymmetric High-Pass waveform" is employed which is identical to the waveform of the SP selective RF pulse RF4.

In the unit sequence 710 as described above, a nuclear magnetic resonance signal Sig. 1 is generated from inside the measurement object region 450, the signal assuming the point of time after a lapse of $(\tau_2/2)$ from the application of the 180° pulse RF3 as the echo time (maximum signal time). The nuclear magnetic resonance signal Sig. 1 thus generated has signal variation in the time axis direction, and includes the aforementioned chemical shift information. In the MRI device 100 of the present embodiment, the reception coil 6 detects this nuclear magnetic resonance signal Sig. 1 at predetermined sampling intervals.

In the MRS measurement of the present embodiment, the unit sequence made up of a series of procedures as described above is repeated N times, while increasing the echo time TE of the entire unit sequence by a predetermined shift interval $\Delta TE$. TE for the entire unit sequence corresponds to the time from the center time for applying the 90° pulse RF1 to the center time for acquiring the echo signal Sig. 1. In addition, $\Delta TE$ is determined on the basis of the frequencies constituting a side lobe of the suppression object compounds.

TE(n) (n=1, 2, 3, ..., N) of the entire unit sequence for the $n^{th}$ time measurement (the $n^{th}$ measurement) of the present embodiment varies as the following formulas (3) to the formula (7):

$$TE(1) \text{ of the first measurement} = \tau_1 + \tau_2 \quad (3)$$

$$TE(2) \text{ of the second measurement} = \tau_1 + \tau_2 + \Delta TE \times 1 \quad (4)$$

$$TE(3) \text{ of the third measurement} = \tau_1 + \tau_2 + \Delta TE \times 2 \quad (5)$$

...

$$TE(i) \text{ of the } i^{th} \text{ measurement} = \tau_1 + \tau_2 + \Delta TE \times (i-1) \quad (6)$$

...

$$TE(N) \text{ of the } N^{th} \text{ measurement} = \tau_1 + \tau_2 + \Delta TE \times (N-1) \quad (7)$$

In addition, FIG. 7B shows the unit sequence 720 of the $N^{th}$ measurement when the echo time TE(n) varies as shown above.

As discussed above, in the present embodiment, the shift interval $\Delta TE$ is made narrower, or the number of times of repetition N is decreased, thereby narrowing the variation range of the echo time TE, and even when the echo time TE is the shortest, an vacant time for inserting the SP selective RF pulses RF4 and RF5 (e.g., the pulse length=30 ms) is reserved. By way of example, when the shift interval $\Delta TE$ is 1.2 ms, the echo time TE(1) is set within the range from 90.0 ms to 166.8 ms, and the SP selective RF pulses RF4 and RF5 with the pulse length 30 ms are inserted.

In the unit sequence of the present embodiment, it is desirable that the SP selective RF pulse RF4 and the SP selective RF pulse RF5 are inserted at a symmetrical timing with respect to the 180° pulse RF3.

In the unit sequence of the present embodiment, it is assumed that the application waveform and the application time of each of the SP selective RF pulses RF4 and RF5 are fixed to be constant, irrespective of the variation of the echo time TE.

In the present embodiment, the unit sequence, the number of times of repetition N, the echo time TE, the shift interval $\Delta TE$ are stored in the memory 13 in advance. In addition, the application waveform and the application time of each of the SP selective RF pulses RF4 and RF5 are also stored in the memory 13 in advance. It is further possible to configure such that the number of times of repetition N, the echo time TE, and the shift interval $\Delta TE$ are inputted as imaging conditions, via the input unit 15 by the user.

The computer 12 of the present embodiment executes the MRS sequence 700, subjects N nuclear magnetic resonance signals Sig. n (n=1, 2, 3, ..., i, ..., N) being acquired to the complex integration, and the Fourier transform in the time axis direction is applied thereto, thereby obtaining magnetic resonance spectra signals. In the magnetic resonance spectra signals thus obtained, according to the SP selective RF pulses RF4 and RF5, the dispersion-refocusing GC pulses Gd41, Gd52, Gr41, and Gr52, only the transverse magnetization of lipids is brought into the pseudo saturation state, and the spectra signals from the lipid peak (lipid main-band signals) are suppressed. Since the nuclear magnetic resonance signals obtained by varying the echo time TE are integrated, lipid side-band signals different in the generation cycle may be canceled or weakened. Therefore, according to the MRS sequence 700 of the present embodiment, it is possible to obtain magnetic resonance spectra signals, in which the lipid main-band signals and lipid side-band signals are suppressed.

As described above, the MRS sequence 700 of the present embodiment is a pulse sequence that is capable of suppressing both the lipid main-band signal and the lipid side-band signal. According to the present embodiment, both the lipid main-band signal and the lipid side-band signal can be suppressed with a high degree of precision, thereby allowing an extremely feeble Cho signal to be detected. Therefore, in the breast MRS measurement, even when the lipid main-band signal is large, or the lipid side-band signal is large, or both signals are large, it is possible to obtain sufficient suppression effect, resulting in that stable breast MRS measurement can be achieved.

In the present embodiment, the lipid is assumed as the suppression object compounds, and the feeble Cho signal is assumed as the detection object. In the present embodiment, the band characteristic of the SP selective RF pulse is changed, and accordingly, it is possible to suppress the main-band signal and the side-band signal of other compounds. Therefore, according to the present embodiment, in the MRS measurement, it is possible to suppress with a high degree of precision, incorporation of a signal of an unwanted compounds hindering the measurement of the measurement object signal, independent of the imaging object region and the measurement object signal, and stably obtain a favorable signal spectrum.

Second Embodiment

Next, an explanation will be made as a second embodiment to which the present invention is applied. In the first embodiment, when the measurement is repeated while the echo time TE is made to shift N times at the shift intervals ΔTE, the application waveform and the application time of the SP selective RF pulse are fixed to be constant, irrespective of the variation of the echo time TE. The second embodiment takes advantage of the situation that as the echo time TE becomes longer, the interval between the end time for applying the 180° pulse RF2 and the start time for applying the 180° pulse RF3, and the interval between the end time for applying the 180° pulse RF3 and the start time for signal detection becomes longer, thereby changing a period of time for applying the SP selective RF pulse to be inserted, according to the lengths of these intervals. Hereinafter, the present invention will be explained, focusing on the configuration being different from the first embodiment.

A pulse sequence of the present embodiment will be explained. In the present embodiment, similar to the first embodiment, the PRESS method is employed as the pulse sequence to implement the MRS measurement. In order to suppress lipids, just like the Dual BASING method, the measurement is repeated, while allowing the SP selective RF pulse application time and the signal detection start time to shift little by little, together with applying the SP selective RF pulse and the dispersion-refocusing GC pulses, and obtained multiple signals with various echo times TE are integrated. It is to be noted here that in the present embodiment, the period of time for applying the SP selective RF pulse is changed, according to the echo time TE.

Figure 8A:
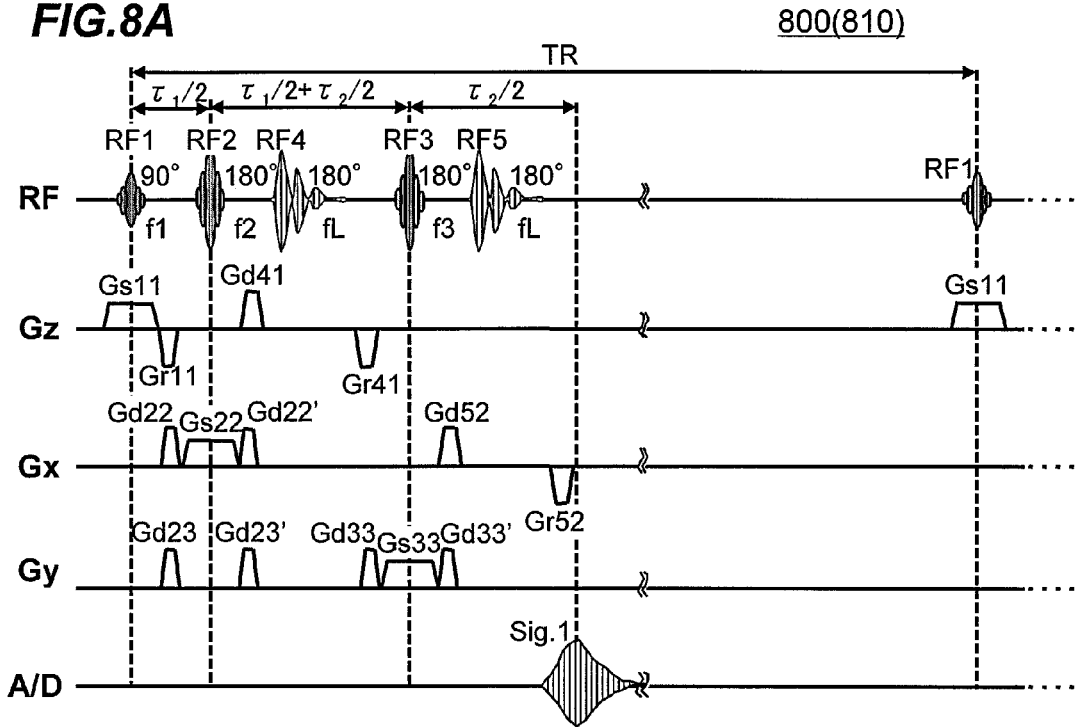
FIG. 8A is a pulse sequence diagram of the unit sequence with the echo time being the shortest according to a second embodiment.
Figure 8B:
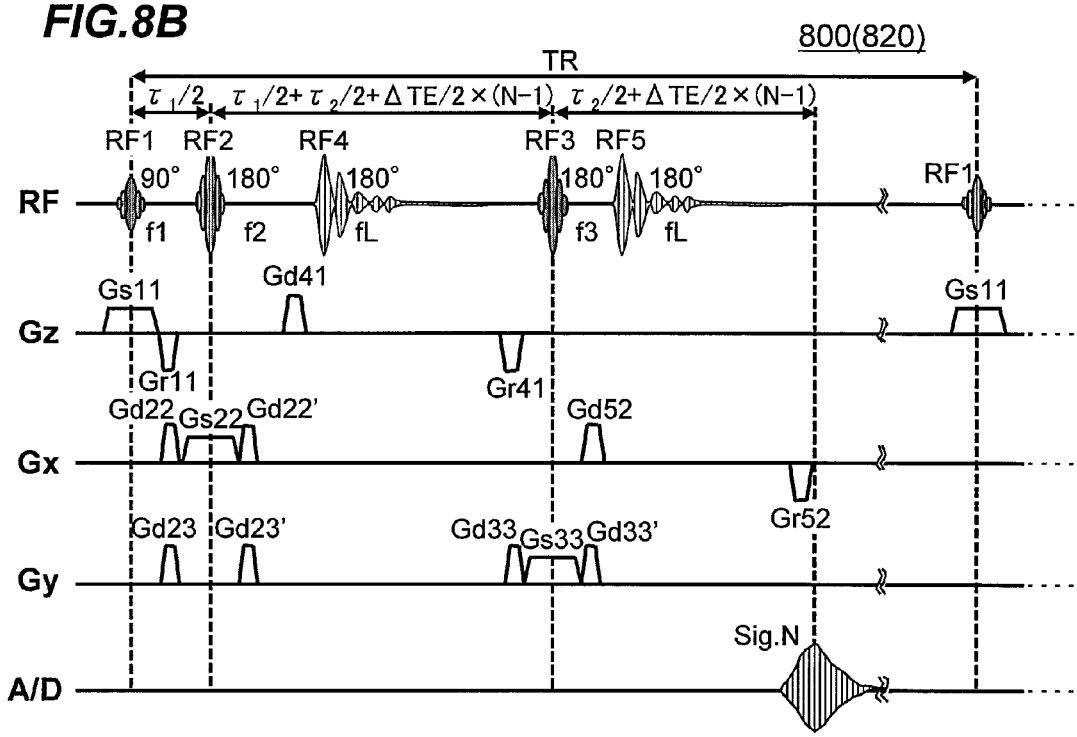
FIG. 8B is a pulse sequence of the unit sequence with the echo time being the longest according to a second embodiment.

Hereinafter, with reference to the drawings, a characteristic portion of the present embodiment will be explained. FIG. 8A and FIG. 8B show sequences diagram for explaining the MRS sequences 800 being the pulse sequences of the present embodiment. Here, the pulses having the same mode of action as in each of the pulse sequences described above are labeled the same.

The MRS sequence 800 of the present embodiment is made up of repetition of the unit sequence from applying 90° pulse RF1 until receiving the echo signal Sig., corresponding to the pulse sequence 520 of the Dual BASING method. During this repetition, the period of time for applying the SP selective RF pulse is also changed, together with shifting the time for applying the region selective RF pulse (RF3) and the signal detection start time little by little in the similar manner as the aforementioned TE-Averaging method. FIG. 8A shows the unit sequence 810 with the shortest TE, and FIG. 8B shows the unit sequence 820 with the longest echo time TE.

The unit sequence 810 as shown in FIG. 8A is the same as the unit sequence 710 of the first embodiment, and therefore, specific explanations will not be made, here. A method for determining $\tau_1$ and $\tau_2$ is carried out in the similar manner.

In the MRS measurement of the present embodiment, similar to the first embodiment, the unit sequence made up of the aforementioned series of procedures is repeated N times, while increasing the echo time TE of the entire unit sequence is increased by a predetermined shift interval ΔTE. On this occasion, similar to the first embodiment, TE(n) (n=1, 2, 3, . . . , i, . . . , N) of the entire unit sequence for the $n^{th}$ time measurement (the $n^{th}$ measurement) undergoes the changes as shown in the aforementioned formulas (3) to (7). FIG. 8B shows the unit sequence 820 at the time of last $N^{th}$ measurement, when the echo time TE (n) varies in this manner.

Further in the present embodiment, the application waveform (pulse waveform) and the application period of time (pulse length) of each of the SP selective RF pulses RF4 and RF5 are changed according to the change of the echo time TE. In other words, when the echo time TE becomes longer, the pulse length is made longer in proportion thereto. In the present embodiment, the lengths of the SP selective RF pulses RF4 and RF5 in each of the unit sequences are firstly determined according to the echo time TE, and after the determination of the pulse lengths, the pulse waveform of each of the SP selective RF pulses is optimized depending on the pulse length.

The pulse length PL(n) (n=1, 2, 3, . . . , N) of the SP selective RF pulse RF4 applied in the unit sequence of the $n^{th}$ measurement is determined, as shown in the following formulas (8) to (12), for instance. Here, L0 indicates the pulse length of the SP selective RF pulse RF4 in the unit sequence 810. Here, by way of example, the case of the SP selective RF pulse RF4 is shown. The followings are similarly applied to the case of the SP selective RF pulse RF5.

$$PL(1) = L0 \tag{8}$$

$$PL(2) = L0 + \Delta TE/2 * 1 \tag{9}$$

$$PL(3) = L0 + \Delta TE/2 * 2 \tag{10}$$

...

$$PL(i) = L0 + \Delta TE/2 * (i - 1) \tag{11}$$

...

$$PL(N) = L0 + \Delta TE/2 * (N - 1) \tag{12}$$

In the present embodiment, the unit sequence, the number of times of repetition N, the echo time TE, shift interval ΔTE are stored in the memory 13, in advance. In addition, the pulse lengths of the SP selective RF pulses RF4 and RF5 for the case where the echo time TE is the shortest, are also stored in the memory 13 in advance. It is also possible to configure such that the number of times of repetition N, the echo time TE, and the shift interval ΔTE are inputted by the user as the imaging conditions.

The computer 12 of the present embodiment executes the MRS sequence 800, subjects thus obtained N nuclear magnetic resonance signals Sig. n (n=1, 2, 3, . . . , N) to the complex integration, applies the Fourier transform in the time axis direction thereto, and obtains the magnetic resonance spectra signals. Similar to the first embodiment, thus obtained magnetic resonance spectra signals are in the state where the lipid main-band signal and the lipid side-band signal are suppressed.

Therefore, according to the present embodiment, similar to the first embodiment, it is possible to suppress both the lipid main-band signal and the lipid side-band with a high degree of precision, thereby enabling detection of extremely feeble Cho signals. Accordingly, in the breast MRS measurement, even when the lipid main-band signal is large, or the lipid side-band signal is large, or both signals are large, it is possible to obtain sufficient suppression effect, thereby achieving stable breast MRS measurement.

In the present embodiment, similar to the first embodiment, any other compounds may be set as the suppression object compounds. Therefore, in the MRS measurement, it is possible to suppress with a high degree of precision, incorporation of a signal of an unwanted compounds hindering the measurement of the measurement object signal, independent of the imaging object region and the measurement object signal, and it is possible to obtain a stably favorable signal spectrum.

In general, as the pulse length becomes longer, the SP selective RF pulse shows more favorable characteristics, as to a pass efficiency (flatness) of the pass band, a suppression rate (flatness) of the stop band, and a width of the transition band, thereby enabling more precise lipid suppression to be carried out. However, the SP selective RF pulse (pulse length=30 ms to 50 ms) employed in a conventional BASING method may fail in performing highly precise lipid signal suppression, because the pass efficiency (flatness) of the pass band and the suppression rate (flatness) of the stop band are not sufficient and the width of the transition band is too wide, and the like, due to the reasons that the pulse length is insufficient, transmission sensitivity of the transmission coil is inhomogeneous, and the like. However, in the present embodiment, it is possible to set a sufficiently long pulse length in each of the unit sequence, and this improves the pass efficiency (flatness) of the pass band, the suppression rate (flatness) of the stop band, and the width of the transition band of the SP selective RF pulse, thereby enabling a highly precise lipid signal suppression. Further in the present embodiment, the pulse length of the SP selective RF pulse becomes longer along with the increase in length of the echo time TE. Therefore, there is no possibility that any useless vacant time is generated.

Furthermore, it is also known in general that as for an RF pulse, the longer becomes the pulse length thereof, the more improved is the excitation profile. Therefore, according to the present embodiment, along with the improvement of the excitation profile, the pass efficiency (flatness) of the pass band is enhanced more, thereby mitigating a signal attenuation of the metabolite (including an observation target compounds), treated as outside the suppression object.

As described so far, according to the present embodiment, it is possible to provide an effect similar to that of the first embodiment. In addition, according to the present embodiment, it is possible to suppress a signal of an unwanted compounds efficiently and stably, with a high degree of precision.

So far, each of the embodiments to which the present invention is applied has been explained. The present invention is not limited to the aforementioned embodiments, but various modifications and applications are available.

By way of example, each of the aforementioned embodiments may be configured in such a manner that water suppression is performed concurrently. Typically, compared to the concentration of the metabolite, the concentration of water being contained inside a human body is extremely high. Therefore, if the measurement is performed without suppressing the signals of water of high concentration, extremely feeble signals of metabolite are embedded in the tail of a huge signal peak generated from the water, and therefore, in many cases, it is difficult to separate and extract the signals from the metabolite. In order to solve this problem, immediately before executing the pulse sequence for performing an ordinary excitation and detection, a pre-pulse sequence is executed for suppressing the generation of signals of water, thereby suppressing unwanted signals of water.

Figure 9:
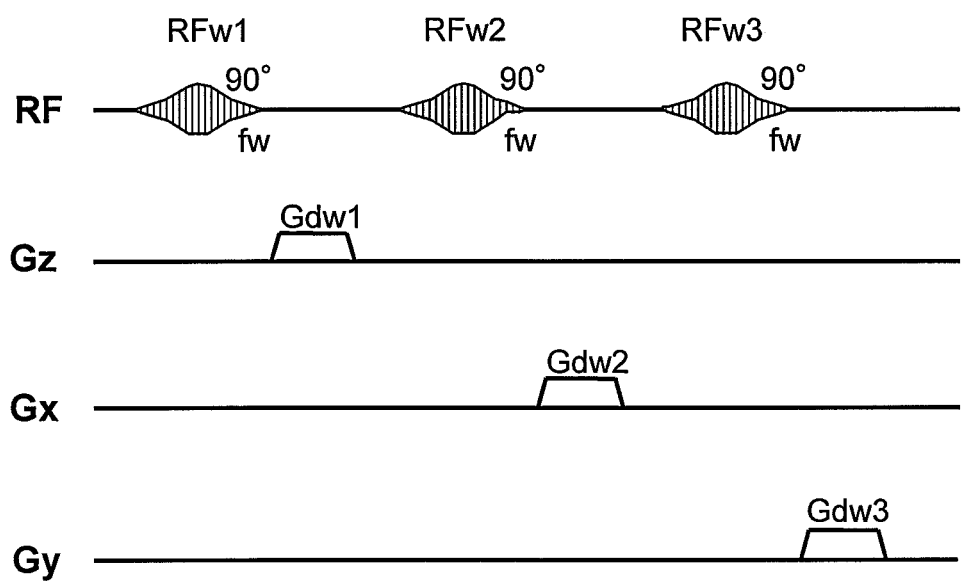
FIG. 9 is a pulse sequence diagram showing a water suppression sequence.

FIG. 9 shows the pre-pulse sequence (water suppression sequence) 900, which is executed to carry out the water-suppressed measurement, for measuring the metabolite after suppressing the signals of water in high concentration. The water suppression sequence 900 is executed before each of the unit sequence in the MRS sequences 700 and 800 in the aforementioned embodiments. In other words, the water-suppressed measurement executes a pulse sequence which combines the water suppression sequence 900 of FIG. 9 with the unit sequence in the MRS sequences 700 and 800 of each of the aforementioned embodiments.

Here, an explanation will be made as to the operation and the effect thereof according to the water suppression sequence 900 as shown in FIG. 9. Firstly, in order to excite the nuclear magnetization contained only in the water molecule, the an RF pulse (water excitation RF pulse) RFw1 is applied, with the settings such that the transmit frequency is set to be the resonance frequency fw of water and the excitation frequency band has a width approximately equivalent to water peak width, and selective excitation on the water nuclear magnetization is performed. Next, a dephasing GC pulse Gdw1 is applied, thereby disassembling the phases of the water nuclear magnetization being in the excitation state and rendering the vector sum of the water nuclear magnetization to be zero, so as to bring the water magnetization into pseudo saturation.

In addition, in order to enhance the suppression effect on the signals of water, the water excitation RF pulse and the dephasing GC pulse, similar to the water excitation RF pulse RFw1 and the dephasing GC pulse Gdw1 are applied repeatedly more than once. The water suppression sequence 900 as shown in this figure is a pulse sequence which repeats the application of the water excitation RF pulse and the dephasing GC pulse for three times. As illustrated, this is an example in which the water excitation RF pulse RFw2 and the dephasing GC pulse Gdw2, and the water excitation RF pulse RFw3 and the dephasing GC pulse Gdw3 are applied, subsequent to the water excitation RF pulse RFw1 and the dephasing GC pulse Gdw1, while changing the application axis of each dephasing GC pulse.

Then, during when the pseudo saturation state of the water magnetization continues according to the water suppression sequence 900, the unit sequence of each of the MRS sequences 700 and 800 of the aforementioned embodiments is executed, and an extremely feeble signal of the metabolite is measured. In the water suppression sequence 900, for the water excitation RF pulse, a gauss waveform is employed whose excitation frequency has the narrow band characteristic. Furthermore, its flip angle is set to be around 90 degrees in many cases.

It is to be noted that in the water suppression sequence 900, the number of applications of the water excitation RF pulse and the dephasing GC pulse is not limited to three. Further in the example shown in FIG. 9, any one of the GC pulses in the axes Gx, Gy, and Gz is applied as the dephasing GC pulse. However, it is also possible to apply all the GC pulses in all the three axes Gx, Gy, and Gz simultaneously, or any of two axes may be applied simultaneously. For the dephasing GC pulse, various combinations or numerical values may be employed, as the number of the application axes and the application strength (application polarity).

In each of the aforementioned embodiments, the explanation is made taking as an example that "High-Pass waveform" is employed as the SP selective RF pulse, but the waveform of the SP selective RF pulse is not limited to this example. By way of example, it is possible to use a Band-Stop waveform. The Band-Stop waveform is an RF waveform having a frequency characteristic that two stop (excitation) bands are provided. If the centers of the two stop frequency bands of the Band-Stop waveform are respectively set as the signals of water peak and the lipid signal peak, suppression of the water signals by using the pre-pulse sequence 900 as shown in FIG. 9 becomes unnecessary.

Moreover, in each of the aforementioned embodiments, the explanation is made taking as an example that the Dual BASING method is employed in which the SP selective RF pulse is applied twice in each of the unit sequences. It is further possible to configure such that the Single BASING method is employed in which the SP selective RF pulse is applied once in each of the unit sequences. It is alternatively possible to configure such that the user is allowed to select via the input unit 15, whether the Dual BASING method is used or the Single BASING method is used.

In each of the aforementioned embodiments, the explanation is made taking as an example that an asymmetric RF waveform is employed as the SP selective RF pulse, but it is alternatively possible to use a symmetric RF waveform as the SP selective RF pulse. Typically, when the asymmetric RF wave is used, more high-frequency components are contained if the pulse length is the same, and therefore the profile is enhanced. However, if the application of the SP selective RF pulse is just once, and the asymmetric RF waveform is selected, non-linear correction of a received phase becomes necessary according to the non-linear characteristics of the excitation phase. Therefore, when the Single BASING method is used for each of the unit sequences, it is desirable to employ the symmetric RF waveform. It is to be noted if the Dual BASING method is used for each of the unit sequences, the SP selective RF pulse is applied twice and the influences therefrom are canceled each other. Therefore, the non-linear correction is not required.

In the MRS pulse sequence of the each of the aforementioned embodiments, two pairs of GC pulses, between the GC pulses Gd22 and Gd23 for dephasing, and the GC pulses Gd22' and Gd23' for rephasing, are applied before and after the 180° pulse RF2, respectively, and a pair of GC pulses, the GC pulse Gd33 for dephasing and the GC pulse Gd33' for rephasing are applied before and after the 180° pulse RF3, respectively. However, as for these GC pulses, they are not necessarily two pairs and one pair in this manner, but similar effects can be obtained in any patterns; three pairs, two pairs, and one pair. As for the application polarity of the GC pulse, homopolarity between the pulses forming the pair is only required. In addition, the application timing is not limited to immediately before and after the 180° pulse, but application at any point of time is accepted, as far as the timing provides a similar effect.

In each of the aforementioned embodiments, Phase-cycling may be conducted. The Phase-cycling is a control procedure to invert and/or revert the phase of the region selective RF pulse and the AD polarity upon signal detection, in order to suppress a false signal incorporated from a region other than a selected voxel being the measurement object region. Typically, it is executed in repetition of the pulse sequence having the same echo time TE. The present embodiment performs the TE shift in which the echo time TE is changed for each unit sequence, and therefore the echo time TE varies from one unit sequence to another. Therefore, in the case where the phase-cycling is applied to each of the embodiments, the phase of the region selective RF pulse and the AD polarity upon signal detection are controlled to be a predetermined phase and polarity, appropriate for each of the unit sequences being different in the echo time TE. However, since variation in the TE time is small, an attenuation effect can be provided, which is similar to an aliasing attenuation effect by the original Phase-cycling.

In addition, in each of the aforementioned embodiments, the explanation is made taking as an example that the PRESS method is used as the MRS measurement. However, this is not the only example. By way of example, the procedure explained in each of the aforementioned embodiments is applicable to a pulse sequence of publicly known MRS measurements, such as the STEAM method as one example. In any of the methods being used, it is sufficient to configure such that an SP selective RF pulse is applied in the state where the transverse magnetization of an unwanted compounds is generated.

In each of the aforementioned embodiments, the explanation is made taking as an example that the pulse sequence of each embodiment is applied to the MRS measurement for measuring spectra signals from one to several regions, but this is not the only example. The pulse sequence of the present embodiment may be applied to magnetic resonance spectroscopic imaging (hereinafter abbreviated as "MRSI") measurement in which spectra of a large number of regions (voxels) are simultaneously acquired and an image is created for each molecule. By way of example, in the MRSI measurement which executes measurement with a high-speed MRSI pulse sequence, or the like, using a general pulse sequence referred to as 3D-CSI and 4D-CSI, an oscillation GC pulse referred to EPSI, and the like, in combination with a region selection method such as the PRESS method and the STEAM method, it is possible to sufficiently suppress the main-band signal and the side-band signal of an unwanted compounds, similar to each of the embodiments, thereby enabling acquisition of a high-quality image.

In each of the aforementioned embodiments, it is possible to configure such that the MRI device 100 is provided with a user interface (UI) which allows the user to set parameters such as the number of applications of the SP selective RF pulse, the TE shift interval, and the TE shifting count. On this occasion, the user utilizes the display unit 14 and the input unit 15 to set those parameters via the UI. It is also possible to configure such that the number of applications of the SP pulse is set according to the selection from twice, once, and zero. In addition, the settable TE shift interval may include the case where the TE shift is not performed, i.e., the shift interval is equal to zero.

Example

Figure 10A:
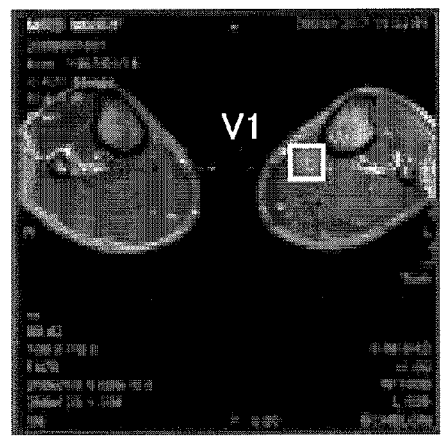
FIG. 10A illustrates a spatial arrangement of the measurement region in an example of the present invention.

Hereinafter, an example of the present invention will be described. Here, the MRI device 100 was employed, which was a horizontal magnetic field system as shown in FIG. 1A with the strength of static magnetic field 1.5 Tesla. The MRS pulse sequence according to the first embodiment was executed subsequent to the pre-pulse sequence (water suppression sequence) as shown in FIG. 9, and the MRS measurement was conducted, targeting at the region V1 inside a human leg as shown in FIG. 10A. In this example here, the measurement object was the human leg, in which a choline Cho signal and a lipid signal were observable in the healthy state, because the choline Cho signals were not able to be observed in a healthy human breast. A target nuclear species was proton.

Figure 10B:
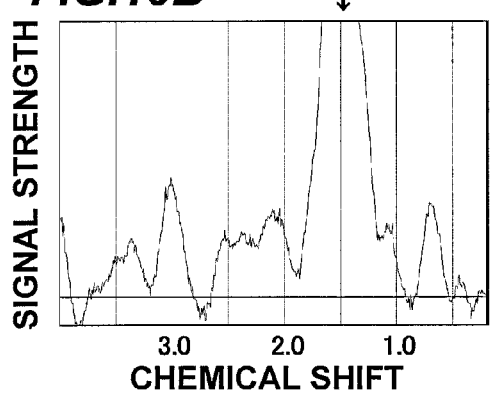
FIG. 10B shows a result of the measurement according to a conventional method.
Figure 10C:
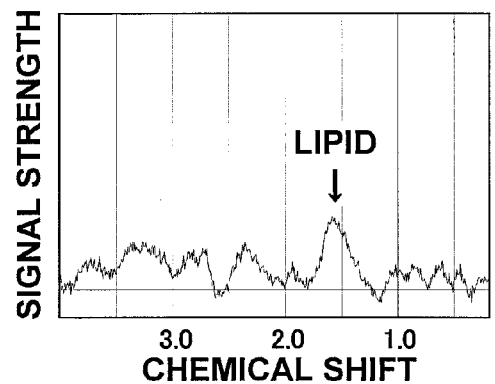
FIG. 10C shows a result of the measurement according to the BASING method.
Figure 10D:
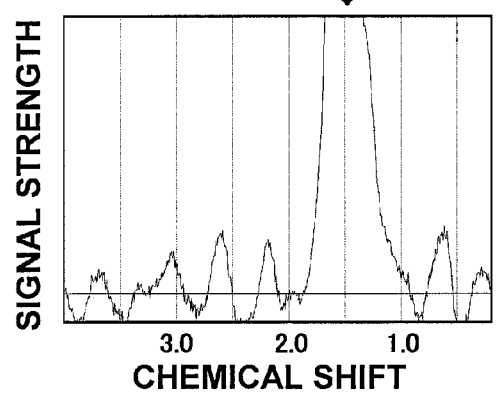
FIG. 10D shows a result of the measurement according to the TE-Averaging method.
Figure 10E:
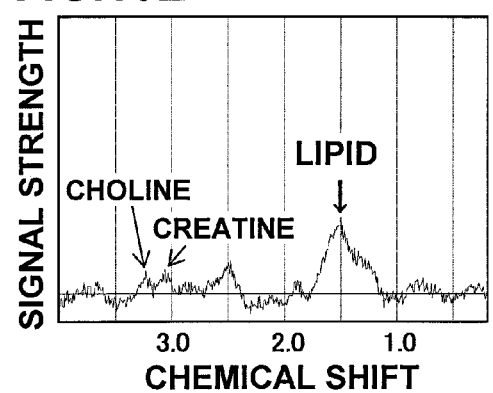
FIG. 10E shows a result of the measurement according to the method of the first embodiment.

FIG. 10B shows a magnetic resonance spectrum data as a measurement result of a conventional method, FIG. 10C shows a magnetic resonance spectrum data as a measurement result when the BASING method was used, FIG. 10D shows a magnetic resonance spectrum data as a measurement result when the TE-Averaging method was used, and FIG. 10E shows a magnetic resonance spectrum data as a measurement result when the MRS sequence 700 of the first embodiment was used (hereinafter, referred to as "a method suggested by the present application").

As illustrated, it is found that FIG. 10E of the measurement spectrum obtained by the method suggested by the present application, shows that both the main-band signals and side-band signals of enormous lipid signals were suppressed to small signal peaks having no influence on other signals, and signals of choline (and creatine) were clearly identified.

In the measurement of the present embodiment, as the SP selective RF pulse for the lipid suppression, an asymmetric (MaxPhase) High-Pass (Single-band) waveform with a pulse length=30.72 ms was used, setting the frequency width of the pass band to be 130 Hz, and the center frequency of the pass band was set to be 1.1 ppm. Conditions for waveform optimization were set as the following; the ripple amount (ratio) of the pass band was 0.5%, the ripple amount (ratio) of the stop band was 0.5%, and the frequency width of the transition band was 60 Hz.

In addition, the TE shift interval ΔTE upon measurement was 1.2 ms, the TE shifting count N was 64 times, and the variable range of the echo time TE ($=\tau_1+\tau_2$) was set to be from 97.6 ms to 174.4 ms (average TE=136 ms). Here, the length of $\tau_1$ was fixed to 15 ms. The repetition time TR was set to be 2,000 ms, and a cumulative number was set to 1, resulting in that the measurement time was 2.1 minutes in each measurement.

EXPLANATION OF REFERENCES

1: subject, 2: static magnetic field coil, 3: gradient coil, 4: shim coil, 5: transmission coil, 6: reception coil, 7: gradient magnetic field power supply, 8: shim power supply, 9: transmitter, 10: receiver, 11: sequence controller, 12: computer, 13: memory, 14: display unit, 15: input unit, 100: MRI device, 200: MRI device, 300: MRI device, 400: PRESS method pulse sequence, 410: transverse image, 420: sagittal image, 430: coronal image, 441: first slice, 442: second slice, 443: third slice, 450: measurement object region, 510: Single BASING method pulse sequence, 520: Dual BASING method pulse sequence, 600: TE-Averaging method pulse sequence, 700: MRS sequence, 710: unit sequence for the shortest TE, 720: unit sequence for the longest TE, 800: MRS sequence, 810: unit sequence for the shortest TE, 820: unit sequence for the longest TE, 900: water suppression sequence, Gd21: dephasing GC pulse, Gd21': dephasing GC pulse, Gd22: dephasing GC pulse, Gd22': dephasing GC pulse, Gd23: dephasing GC pulse, Gd23': dephasing GC pulse, Gd31: dephasing GC pulse, Gd31': dephasing GC pulse, Gd32: dephasing GC pulse, Gd32': dephasing GC pulse, Gd33: dephasing GC pulse, Gd33': dephasing GC pulse, Gd41: dispersion-refocusing GC pulse, Gd41: dispersion-refocusing GC pulse, Gd51: dispersion-refocusing GC pulse, Gdw1: dephasing GC pulse, Gdw2: dephasing GC pulse, Gdw3: dephasing GC pulse, Gr11: rephasing GC pulse, Gr41: dispersion-refocusing GC pulse, Gr41: dispersion-refocusing GC pulse, Gr52: dispersion-refocusing GC pulse, Gs11: slice selective GC pulse, Gs22: slice selective GC pulse, Gs33: slice selective GC pulse, Gx: gradient magnetic field in the X axis, Gy: gradient magnetic field in the Y axis, Gz: gradient magnetic field in the Z axis, RF: radio frequency magnetic field, RF1: 90° pulse, RF2: 180° pulse, RF3: 180° pulse, RF4: SP selective RF pulse, RF5: SP selective RF pulse, RFw1: water excitation RF pulse, RFw2: water excitation RF pulse, RFw3: water excitation RF pulse, Sig1: nuclear magnetic resonance signal, SigN: nuclear magnetic resonance signal, TE: echo time, TR: repetition time, ΔTE: shift interval

What is claimed is:

1. A magnetic resonance imaging device, comprising a magnetic field generation unit to generate a static magnetic field, a radio frequency magnetic field, and a gradient magnetic field, a detection unit to detect a nuclear magnetic resonance signal generated from a subject placed in the static magnetic field, a computing unit to create a magnetic resonance spectrum from the nuclear magnetic resonance signal and displaying the magnetic resonance spectrum on a display unit, and a measurement control unit to control operations of the magnetic field generation unit, the detection unit, and the computing unit, and executing spectrum measurement for collecting the nuclear magnetic resonance signals which allow the magnetic resonance spectrum to be created, the measurement control unit comprising, a region selection unit to apply at least one pair of a region selective inversion radio frequency magnetic field and a slice selective gradient magnetic field, selectively inverting nuclear magnetization included only in a predetermined region, while repeating the spectrum measurement for a predetermined number of times, with changing the echo time at predetermined shift intervals, and a suppression unit to apply a spectrum selective inversion radio frequency magnetic field for selectively inverting only the nuclear magnetization included in a predetermined compounds, at least one of before and after applying the region selective inversion radio frequency magnetic field and the slice selective gradient magnetic field, and simultaneously applying a phase dispersion gradient magnetic field and a phase refocusing gradient magnetic field, being identical in the magnitude of application amount and different in application polarity, before and after the spectrum selective inversion radio frequency magnetic field, respectively.

2. The magnetic resonance imaging device according to claim 1, wherein, the measurement control unit changes a period of time for applying the spectrum selective inversion radio frequency magnetic field, according to a length of the echo time of the spectrum measurement which applies the spectrum selective inversion radio frequency magnetic field.

3. The magnetic resonance imaging device according to claim 2, wherein, the measurement control unit sets a lower limit of a variable range of the echo time to be at least 90 ms.

4. The magnetic resonance imaging device according to claim 1, wherein, the measurement control unit sets a lower limit of a variable range of the echo time to be at least 90 ms.

5. The magnetic resonance imaging device according to claim 1, wherein, the measurement control unit comprises a user interface which allows a user to set at least one of the followings; the number of applications of the spectrum selective inversion radio frequency magnetic field, the shift interval, and the number of times of changing the echo time of the spectrum measurement.

* * * * *